United States Patent
Zhao et al.

(10) Patent No.: US 11,295,937 B2
(45) Date of Patent: Apr. 5, 2022

(54) BROADBAND PLASMA PROCESSING SYSTEMS AND METHODS

(71) Applicant: Tokyo Electron Limited, Tokyo (JP)

(72) Inventors: Jianping Zhao, Austin, TX (US); Peter Ventzek, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 320 days.

(21) Appl. No.: 16/717,024

(22) Filed: Dec. 17, 2019

(65) Prior Publication Data

US 2021/0082667 A1 Mar. 18, 2021

Related U.S. Application Data

(63) Continuation-in-part of application No. 16/572,708, filed on Sep. 17, 2019, now Pat. No. 11,170,981.

(51) Int. Cl.
*H01L 21/02* (2006.01)
*H01J 37/32* (2006.01)
*H01L 21/311* (2006.01)

(52) U.S. Cl.
CPC .... *H01J 37/3299* (2013.01); *H01J 37/32155* (2013.01); *H01J 37/32183* (2013.01);
(Continued)

(58) Field of Classification Search
CPC .......... H01J 37/32183; H01J 37/32174; H01J 37/32091; H01J 37/321; H01J 2237/327
See application file for complete search history.

(56) References Cited

U.S. PATENT DOCUMENTS

| 5,865,937 A | 2/1999 | Shan et al. |
| 6,043,607 A * | 3/2000 | Roderick .......... H01J 37/32082 118/723 R |

(Continued)

FOREIGN PATENT DOCUMENTS

KR 20030051692 A 6/2003

OTHER PUBLICATIONS

PCT International Search Report and Written Opinion, International Application No. PCT/US2020/042725, dated Nov. 5, 2020, 14 pages.

(Continued)

*Primary Examiner* — Jaehwan Oh
(74) *Attorney, Agent, or Firm* — Slater Matsil, LLP

(57) ABSTRACT

A method of operating a plasma processing system includes determining a first frequency to power a first plasma within a plasma processing chamber. The method includes generating a first amplified RF signal having the first frequency at a broadband power amplifier. The method includes supplying the first amplified RF signal to process a substrate disposed in the plasma processing chamber using a first plasma process including the first plasma. The method includes determining a second frequency to power a second plasma within the plasma processing chamber. The method includes generating a second amplified RF signal having the second frequency at the broadband power amplifier. The method includes supplying the second amplified RF signal to process the substrate disposed in the plasma processing chamber using a second plasma process including the second plasma.

20 Claims, 11 Drawing Sheets

(52) U.S. Cl.
CPC .. *H01L 21/02274* (2013.01); *H01L 21/31116* (2013.01); *H01J 2237/24564* (2013.01); *H01J 2237/3321* (2013.01); *H01J 2237/3341* (2013.01)

(56) References Cited

U.S. PATENT DOCUMENTS

| | | | |
|---|---|---|---|
| 6,541,380 B2 | 4/2003 | Ying et al. | |
| 6,920,312 B1* | 7/2005 | Benjamin | H01J 37/32082 330/149 |
| 7,625,460 B2* | 12/2009 | Howard | H01J 37/32165 118/723 E |
| 8,083,961 B2* | 12/2011 | Chen | H01J 37/32009 216/61 |
| 8,674,606 B2* | 3/2014 | Carter | H05H 1/46 315/111.21 |
| 9,576,811 B2 | 2/2017 | Kanarik et al. | |
| 9,578,731 B2* | 2/2017 | Van Zyl | H01J 37/32082 |
| 9,748,076 B1* | 8/2017 | Choi | H01J 37/3299 |
| 10,304,663 B1* | 5/2019 | Kapoor | H01J 37/3299 |
| 2003/0207583 A1* | 11/2003 | Kuthi | H01J 37/32146 438/714 |
| 2004/0060660 A1 | 4/2004 | Klimecky et al. | |
| 2004/0242021 A1* | 12/2004 | Kraus | H01L 21/28202 438/776 |
| 2005/0112891 A1* | 5/2005 | Johnson | H01L 21/30655 438/691 |
| 2006/0037701 A1* | 2/2006 | Koshiishi | H01L 21/31116 156/345.44 |
| 2006/0262889 A1* | 11/2006 | Kalvaitis | H01J 37/32082 375/355 |
| 2007/0029500 A1* | 2/2007 | Coulombe | H05H 1/48 250/423 F |
| 2007/0107844 A1 | 5/2007 | Bullock et al. | |
| 2010/0159705 A1 | 6/2010 | Qiu et al. | |
| 2011/0006687 A1* | 1/2011 | Gesche | H01J 37/32082 315/111.21 |
| 2012/0064726 A1 | 3/2012 | Nozawa et al. | |
| 2015/0011073 A1 | 1/2015 | Lei et al. | |
| 2016/0295677 A1* | 10/2016 | Leeser | H05H 1/46 |
| 2018/0026589 A1* | 1/2018 | Labanc | H03F 1/42 156/345.48 |
| 2018/0068852 A1* | 3/2018 | Cottle | H01L 21/0335 |
| 2019/0006995 A1* | 1/2019 | Jurkov | H03F 3/19 |

OTHER PUBLICATIONS

PCT International Search Report and Written Opinion, International Application No. PCT/US2020/054402, dated Jul. 5, 2021, 12 pages.

* cited by examiner

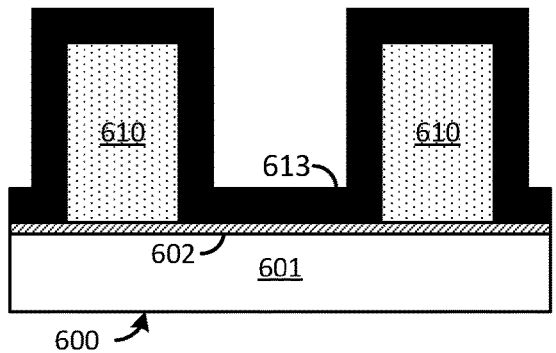
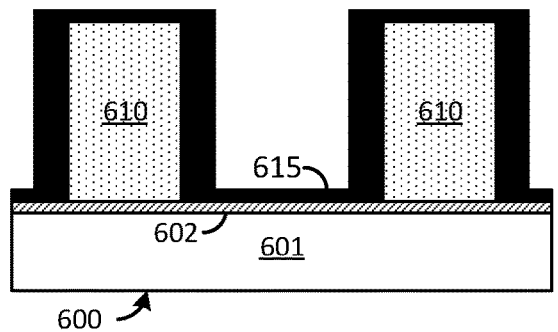
Figure 6A  Figure 6B
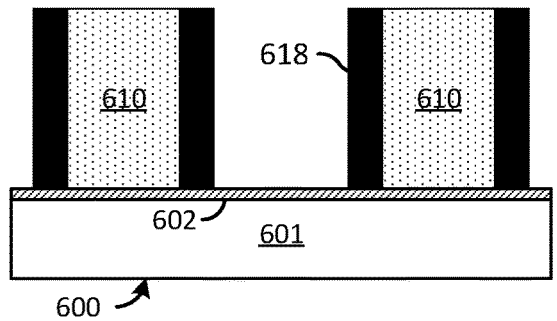
Figure 6C
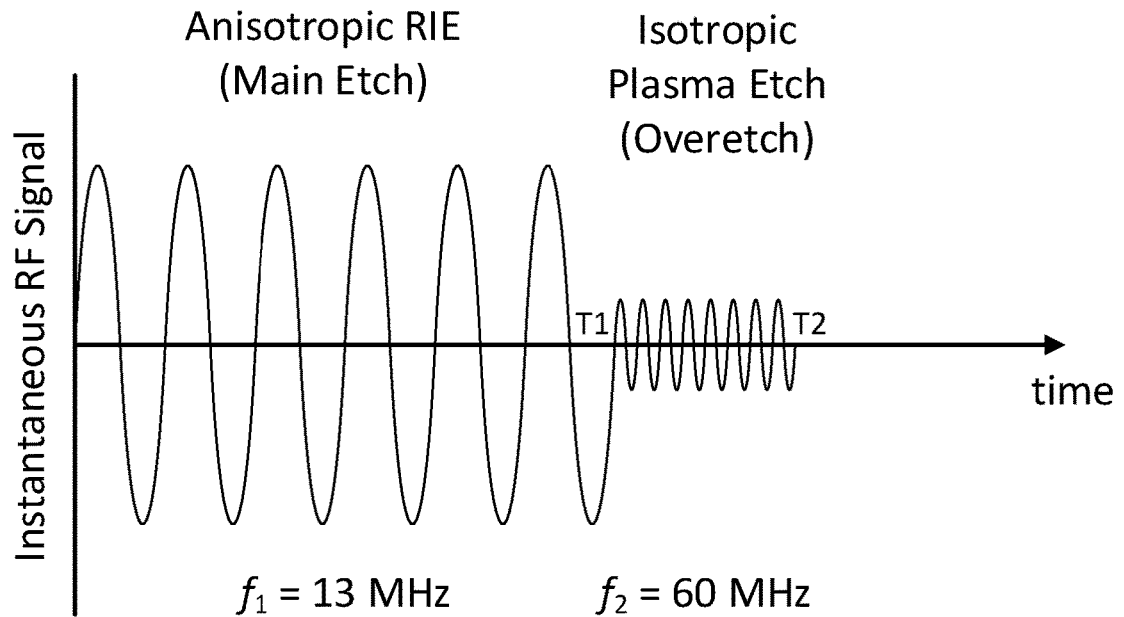
Figure 6D

BROADBAND PLASMA PROCESSING SYSTEMS AND METHODS

CROSS-REFERENCE TO RELATED APPLICATIONS

This application is a Continuation-in-Part of U.S. Non-Provisional application Ser. No. 16/572,708, filed on Sep. 17, 2019, which application is hereby incorporated herein by reference.

TECHNICAL FIELD

The present invention relates generally to plasma systems and methods of operation, and, in particular embodiments, to methods for broadband plasma processing systems.

BACKGROUND

Generally, semiconductor devices, such as integrated circuits (IC's) are fabricated by sequentially depositing and patterning layers of dielectric, conductive, and semiconductor materials over a semiconductor substrate using photolithography and etch to form structures for circuit components and interconnect elements (e.g., transistors, resistors, capacitors, metal lines, contacts, and vias). Some components comprise intricate three-dimensional structures, for example, stack-capacitors in dynamic random access memory (DRAM) cells and fin field-effect transistors (FinFETs). Plasma-assisted techniques such as reactive ion etching (RIE), plasma-enhanced chemical vapor deposition (PECVD), plasma-enhanced atomic layer etch and deposition (PEALE and PEALD) have become indispensable in the deposition and etching processes used to form the semiconductor device structures.

The minimum feature sizes are periodically reduced to reduce cost by increasing packing density. Features of a few nanometers can be patterned with innovations such as immersion lithography and multiple patterning. This scaling trend intensifies the technological challenge in forming dense, high aspect ratio nanostructures. In particular, plasma processes need to provide the capability of forming nanostructures of accurate dimensions along with precisely controlled structural features (e.g., width, depth, edge profile, film thickness, conformality, and anisotropy), often at atomic scale dimensions, uniformly across a wide (e.g., 300 mm) wafer. A variety of plasma processing techniques such as selective deposition and etch, concurrent deposition and etch, pulsed plasma processes, and cyclic processes using pulsed deposition and etch cycles have been developed to overcome some of the hurdles in fabricating scaled semiconductor devices. Successful deployment of such techniques in semiconductor manufacturing may need further innovations in plasma equipment design and plasma processing methods that consider factors such as processing cost, equipment configurability, and equipment cost.

SUMMARY

In accordance with an embodiment of the present invention, a method of operating a plasma processing system includes determining a first frequency to power a first plasma within a plasma processing chamber. The method includes generating a first amplified RF signal having the first frequency at a broadband power amplifier. The method includes supplying the first amplified RF signal to process a substrate disposed in the plasma processing chamber using a first plasma process including the first plasma. The method includes determining a second frequency to power a second plasma within the plasma processing chamber. The method includes generating a second amplified RF signal having the second frequency at the broadband power amplifier. The method includes supplying the second amplified RF signal to process the substrate disposed in the plasma processing chamber using a second plasma process including the second plasma.

In accordance with an embodiment of the present invention, a method of operating a plasma processing system includes performing a first frequency sweep tuning to generate a first radio frequency (RF) signal including a first frequency. The method includes, at a broadband power amplifier, amplifying the first RF signal to generate a first amplified RF signal. The method includes supplying the first amplified RF signal to process a substrate disposed in a plasma processing chamber, the processing of the substrate being powered by the first amplified RF signal. The method includes performing a second frequency sweep tuning to generate a second radio frequency (RF) signal including a second frequency. The method includes, at the broadband power amplifier, amplifying the second RF signal to generate a second amplified RF signal. The method includes supplying the second amplified RF signal to process the substrate disposed in the plasma processing chamber, the processing of the substrate being powered by the second amplified RF signal.

In accordance with an embodiment of the present invention, a method of operating a plasma processing system includes performing a first etch/deposition process on a substrate using a first plasma in a plasma process chamber by powering the first plasma by a first amplified radio frequency signal, the first amplified radio frequency signal including a plurality of first pulses and having a first frequency and first amplitude. The method includes changing the first plasma to a second plasma. The method includes performing a second etch/deposition process on the substrate using a second plasma in the plasma process chamber by powering the second plasma by a second amplified radio frequency signal, the second amplified radio frequency signal including a plurality of second pulses and having a second frequency and second amplitude, the first frequency and the second frequency having different frequency values, where the first amplified radio frequency signal is tuned to the first frequency by a first frequency sweep tuning process and the second amplified radio frequency signal is tuned to the second frequency by a second frequency sweep tuning process.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A-6C illustrate an example sequence of plasma processing steps performed using a broadband plasma processing system, in accordance with an embodiment of the invention;

FIG. 6D illustrates a timing diagram corresponding to the example sequence of plasma processing steps illustrated in FIGS. 6A-6C.

DETAILED DESCRIPTION OF ILLUSTRATIVE EMBODIMENTS

Figure 1:
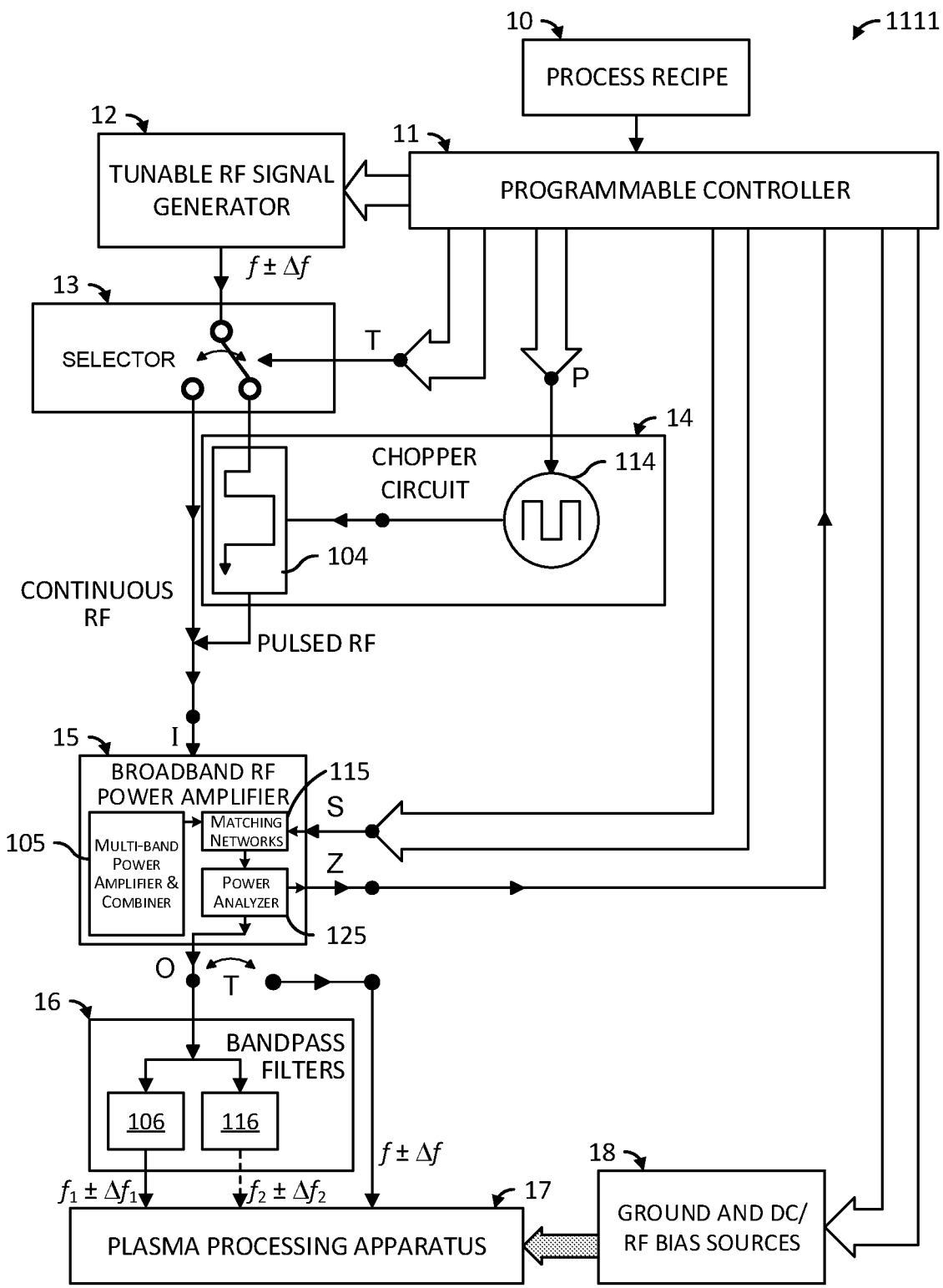
FIG. 1 is a schematic of a broadband plasma processing system, in accordance with an embodiment of the invention.

Embodiments of the present application disclose methods, wherein a series of plasma processing steps are performed in a single plasma processing chamber of a plasma processing apparatus without having to transfer the substrate out of the chamber in between successive plasma processing steps. The different process steps may use different RF signals with frequencies distributed over a broad band. For example, a plasma etch step may be performed at a low pressure to minimize redepositing the etched material, and a low frequency may be desirable at low pressure to obtain a more uniform plasma. On the other hand, a plasma deposition step may be performed at a relatively high pressure and high RF frequency to provide high dissociation amounts. The RF frequency is generally an important process parameter used in plasma processing to achieve a desired plasma environment.

A broadband plasma processing system comprising a broadband tunable RF signal generator and a broadband RF power amplifier is used to accommodate the wide frequency range. Typically, a change in the RF frequency or the processing environment in the plasma processing chamber may alter the impedance of the plasma, thereby disturbing the impedance matching and degrading the power transfer efficiency from the broadband RF power amplifier to the plasma processing apparatus. In the embodiments described in this disclosure, the broadband plasma processing system quickly re-establishes a close to optimal impedance match using a method of impedance tuning referred to as frequency sweep tuning with center-frequency offset.

As described below with reference to FIG. 1 (and in further detail in related application Ser. No. 16/572,708), the frequency sweep tuning with center-frequency offset varies the frequency of the signal to vary a frequency-dependent impedance of a circuit. An electronic feedback control system of the broadband plasma processing system couples the RF frequency at the broadband tunable RF signal generator with the frequency-dependent impedance of an output matching network circuit of the broadband RF power amplifier. A feedback signal that represents the impedance mismatch between the broadband RF power amplifier and the load at its output port is provided to a programmable controller by a built-in power analyzer circuit of the broadband RF power amplifier. The programmable controller uses the feedback signal to fine-tune the frequency of the RF signal generated by the broadband tunable RF signal generator. The frequency offsets are designed to adjust the frequency-dependent impedance of the output matching network circuit of the broadband RF power amplifier continually towards optimal impedance matching. This method of impedance tuning provides ultrafast impedance matching relative to the more traditional methods of mechanically tuning the impedance using electromagnetic relays and servo motors. In some embodiments, frequency sweep tuning with center-frequency offset has response times of the order of microseconds, and can establish a near-optimal impedance match within convergence times of the order of tens of microseconds.

The disclosed embodiments provide implementation of a wide variety of plasma process techniques at a reduced hardware cost and a higher throughput achieved by using single-chamber processing. Because of the ultrafast impedance matching capability of the broadband plasma processing system, the methods described in this application may be advantageously used to implement process flows comprising pulsed plasma processing with rapid transitions between pulses.

In this disclosure, pulsed plasma processing refers to semiconductor processing performed with plasma sustained by RF power supplied in pulses of finite duration. A pulsed plasma process may comprise a single plasma process step such as a deposition step, or an etch step, or a concurrent deposition-and-etch step. A pulsed plasma process may also refer to a cyclic process wherein one cycle comprises some combination of deposition and an etch steps.

The RF power during a single-step pulsed plasma process may be supplied as periodic pulses (short bursts of RF power). The pulse train may also be aperiodic: segmented into several pulses having any combination of signal parameters such as duty cycle, RF frequency, and RF amplitude. A pulsed RF waveform usually comprises RF pulses that are discrete in time, but aperiodic pulses may even be contiguous in time, provided they are otherwise separable, for example, by RF frequency, RF amplitude, and pulse duration, or a combination thereof. Discrete-time RF pulses may be generated by chopping a continuous wave RF (CW-RF) signal using a chopper circuit, as described below with reference to FIG. 1 (and in further detail in related application Ser. No. 16/572,708). However, contiguous-time RF pulses may be generated without a chopper.

The single-step pulsed plasma process may comprise either a conventional plasma step (e.g., PECVD, RIE, and the like) or an atomic layer plasma process (e.g., PEALD or PEALE). For conventional plasma processing, the processing parameters such as gas flow, temperature, and pressure may not be necessarily be altered while the RF power is pulsed. In contrast, an atomic layer deposition or etch process step is performed in cycles of several sub-steps, wherein the processing parameters of the sub-steps are generally different.

A single-step atomic layer plasma process (e.g., PEALD or PEALE) is inherently a single-step pulsed plasma process, as explained herein. One process step comprises several reaction cycles, and each reaction cycle comprises, for example, two different half-reaction pulses separated by purge pulses. At least one half-reaction pulse may use plasma sustained by RF power. With successive half-reaction pulses being separated by a purge pulse, the RF signal naturally comprises short bursts of RF power even if the RF waveform during one half-reaction pulse is unbroken. Such an RF signal may be referred to as an unbroken-pulse RF signal in this disclosure, as opposed to a fragmented-pulse RF signal, wherein the RF waveform during one half-reaction pulse is a packet of sub-pulses, each sub-pulse an ultra-short burst of RF power.

Several cyclic pulsed-plasma processes are described in various embodiments in this disclosure. For example, the process flows implemented may include cyclic deposition/etch processes (e.g., plasma deposition pulses and plasma etch pulses in one cycle). Either or both the plasma deposition and plasma etch pulse may comprise conventional non-limiting gas-phase reaction processes, as in PECVD/RIE, or self-limiting surface reaction processes, as in or PEALD/PEALE processes.

In a PEALD/PEALE process, one atomic layer deposition/etch reaction cycle may comprise several sub-steps, as mentioned above. For example, a surface reaction used to deposit one atomic layer of silicon nitride is completed by two self-limiting half-reactions: a first half-reaction, where the surface is exposed to dichlorosilane gas, and a second self-limiting half-reaction, where the surface is exposed to ammonia plasma. Each half-reaction is followed by a purge step to clear the processing chamber of excess reactants and gaseous by-products. Likewise, a PEALE reaction cycle may comprise a surface conditioning first reaction pulse, such as chlorination in the case of silicon, and a second reaction pulse during which one atomic layer gets removed from the surface. In these examples, one reaction cycle of the PEALD/PEALE process comprises two pairs of pulses, each pair comprising a reaction pulse followed by a purge pulse. In both examples (PEALD silicon nitride and PEALE silicon), the second reaction pulse in the reaction cycle may be using plasma sustained by an RF signal.

The RF signal used during one plasma process pulse in the cyclic deposition/etch processes described above may be an unbroken RF pulse (a short burst of continuous RF power), or a fragmented RF pulse (a packet of sub-pulses, each sub-pulse an ultra-short burst of RF power). The broadband plasma processing system may generate the various pulsed-RF waveforms using a chopper circuit with timing control from a programmable controller in the broadband plasma system. The various combinations of pulsed-plasma processes implementing a cyclic deposition/etch technique, as described above are summarized in Tables 1-4. Table 1 lists the PECVD/RIE combinations, Table 2 lists the PECVD/PEALE combinations, Table 3 lists the PEALD/RIE combinations, and Table 4 lists the PEALD/PEALE combinations.

TABLE 1

Cyclic PECVD/RIE Pulsed Plasma Processes
PECVD Pulse

| RF Pulse Unbroken RIE Pulse | | RF Pulse with sub-pulses RIE Pulse | |
|---|---|---|---|
| RF Pulse Unbroken | RF Pulse with sub-pulses | RF Pulse Unbroken | RF Pulse with sub-pulses |

TABLE 2

Cyclic PECVD/PEALE Pulsed Plasma Processes
PECVD Pulse

| RF Pulse Unbroken PEALE Pulse | | RF Pulse with sub-pulses PEALE Pulse | |
|---|---|---|---|
| RF Pulse Unbroken | RF Pulse with sub-pulses | RF Pulse Unbroken | RF Pulse with sub-pulses |

TABLE 3

Cyclic PEALD/RIE Pulsed Plasma Processes
PEALD Pulse

| RF Pulse Unbroken RIE Pulse | | RF Pulse with sub-pulses RIE Pulse | |
|---|---|---|---|
| RF Pulse Unbroken | RF Pulse with sub-pulses | RF Pulse Unbroken | RF Pulse with sub-pulses |

TABLE 4

Cyclic PEALD/PEALE Pulsed Plasma Processes
PEALD Pulse

| RF Pulse Unbroken PEALE Pulse | | RF Pulse with sub-pulses PEALE Pulse | |
|---|---|---|---|
| RF Pulse Unbroken | RF Pulse with sub-pulses | RF Pulse Unbroken | RF Pulse with sub-pulses |

The disclosed embodiments provide implementation of a wide variety of plasma process techniques at a reduced hardware cost and a higher throughput achieved by using single-chamber processing and frequency sweep tuning with center-frequency offset. However, it is understood that there are more possibilities that may be derived from the disclosed embodiments. In addition to the examples summarized in Tables 1-4, a variety of process flows may be derived comprising various combinations of deposition and etch, wherein it is advantageous to use a broadband plasma processing system similar to those in the embodiments described in this disclosure. For example, a process flow comprising a deposition followed by a different deposition, or a process flow comprising an etch followed by a different etch, or combinations thereof, depending on process specifications for materials, selectivity, conformity, profile, defect density, critical dimension control, and the like. The process flows may comprise conventional PECVD and plasma etch processing techniques, or atomic layer processing (PEALD and PEALE) techniques performed using single-chamber processing with continuous wave RF signals or pulsed RF signals having different RF frequencies.

The short convergence time for impedance matching helps in suppressing uncontrolled power due to transients in the RF waveform that may occur during impedance tuning. Impedance mismatch could result in a voltage spike, for example, when the impedance changes abruptly on ignition of plasma discharge. This may result in surface damage, for example, by unintentionally etching when deposition may be intended. Uncontrolled waveforms may also result in variability or missed pulses. The precise control of RF power supplied to the plasma processing apparatus at each step in the embodiments described in this disclosure is advantageous for plasma processes used in fabricating device structures which uses precisely controlled features for proper functioning.

The plasma processing apparatus may be operated in a sequential mode or in a pulsed mode in various embodiments. In a sequential operation mode, a plasma process step is performed using continuous RF power at a single frequency. For example, a first plasma process step (e.g., a PECVD process) is first performed using continuous RF power at a first RF frequency, and is followed by a second plasma process step (e.g., an RIE process step) performed using continuous RF power at a second RF frequency.

A process step performed in the pulsed operation mode uses pulsed RF power at one or more RF frequencies. A pulsed RF signal may refer to a continuous sinusoidal RF signal whose amplitude is modulated by a square wave pulsing between zero (inactive part) and unity (active part) at a relatively low frequency of about 1 Hz to about 100 kHz. The instantaneous RF power is present only in the plasma active fraction of one pulse period. During the process step the parameters of the pulse train (e.g., pulse frequency and duty cycle) and/or the parameters of the RF signal (e.g., RF frequency and RF amplitude may be changed in accordance with the specifications in the process recipe.

First, a schematic of the broadband plasma processing system and a cross-sectional view of a plasma processing apparatus included therein (FIGS. 1 and 2) are used to provide a general description of the broadband plasma processing system.

Next, two example process sequences illustrating the sequential mode of operation are described with reference to cross-sectional views of semiconductor structures at various stages of processing in FIGS. 3A-3E. The plasma processing method for the sequential mode of operation is then described referring to a flow diagram of one process step illustrated in FIG. 4. Further examples of process flows using the sequential operating mode are illustrated in FIGS. 5, 6, and 7.

An example process sequence illustrating the pulsed mode of operation is then described with reference to cross-sectional views of semiconductor structures in FIGS. 8A-8D. The corresponding plasma processing method for one cycle of the process sequence described with reference to FIGS. 8A-8D is explained referring to a flow diagram illustrated in FIG. 9.

FIG. 1 illustrates a schematic representation of an example broadband plasma processing system 1111 that may be used to operate a plasma processing apparatus 17 in a sequential mode or a pulsed mode to perform a series of plasma processing steps. The broadband plasma processing system 1111 performs a plasma process step in accordance with instructions entered as a process recipe 10 for a programmable controller 11. The programmable controller 11 then generates several electronic control signals in accordance with the process recipe 10. The control signals are transmitted to synchronously configure various components of the broadband plasma processing system 1111.

A broadband tunable RF signal generator 12 provides a continuous RF signal at a frequency set by a first control signal from the programmable controller 11. The first control signal transmitted to the broadband tunable RF signal generator 12 may dynamically shift the RF frequency within a narrow bandwidth around a center-frequency encoded in the process recipe 10. The instantaneous frequency offset is determined by the programmable controller 11 using a feedback signal indicative of the impedance mismatch, as mentioned above. The fine-tuning of the RF signal frequency adjusts the frequency-dependent impedance of an output matching network circuit 115 in the broadband RF power amplifier 15 to reduce the impedance mismatch, and a revised feedback signal is transmitted to the programmable controller. This continuous feedback control loop may converge rapidly to the RF frequency for the most efficient power transfer to the plasma processing apparatus 17.

A second control signal transmitted to the control terminal T of a selector 13 configures a first electronic toggle switch. An electronic toggle switch uses solid-state devices (e.g., thyristors, metal-oxide-semiconductor field-effect transistors (MOSFETs), and insulated-gate bipolar transistors (IGBTs)) to implement a single pole double throw (SPDT) toggle switch. The selector 13 is used to route the continuous RF signal either directly to the input terminal I of a broadband RF power amplifier 15 or via a chopper circuit 14 to generate a pulsed RF waveform (described above).

The chopper circuit 14 chops the continuous RF signal using a gated chopper 104 gated by a low frequency square wave pulse train from a pulse generator 114. The frequency and duty cycle of the pulsed RF signal are set by a third control signal transmitted to the control terminal P of the pulse generator 114 of the chopper circuit 14. In some embodiments, the duty cycle may be set to any value between and including zero and 100% so that the chopper circuit 14 may also be used as an on/off switch. For example, during the time that the duty cycle is set to 100%, the RF signal is continuous and may be used for processing with a continuous RF signal. A duty cycle of zero blocks the RF signal.

The broadband RF power amplifier 15 achieves broadband amplification using a plurality of power amplifiers providing power gain in multiple overlapping frequency bands and combining their outputs in a power amplifier and combiner module 105. The amplified and combined RF signal proceeds to an output matching network circuit 115 and a power analyzer circuit 125 incorporated in the broadband RF power amplifier 15, as illustrated in FIG. 1 and described further in application Ser. No. 16/572,708.

A fourth control signal transmitted to the control terminal S of the built-in output matching network circuit 115 selects one or more of the passive components used in the output matching network circuit 115 (e.g., one of several available load capacitors, $C_L$) appropriate for the RF frequency f of the RF signal generated by the broadband tunable RF signal generator 12. The programmable controller 11 synchronizes the first and fourth control signals to synchronize the center-frequency of the narrow RF band specified in the process recipe 10 with the selected $C_L$ of the output matching network circuit 115. For example, the process recipe 10 may specify a pulsed RF, dual frequency step using a first frequency $f_1$ and a second frequency $f_2$. In processing the step (e.g., using a pulsed dual-frequency operation mode), a first load capacitor $C_{L1}$ may be selected for $f_1$, but it may need to be synchronously switched out for a second load capacitor $C_{L2}$ when the frequency is switched to $f_2$. As mentioned above, further tuning of the impedance of the output matching network circuit 115 is achieved by fine tuning the RF signal frequency.

The RF signal from the output matching network circuit 115 is analyzed by the power analyzer circuit 125 of the broadband RF power amplifier 15. The power analyzer circuit 125 generates a feedback signal proportional to the reflected power (normalized to the forward power delivered by the broadband power amplifier 15), reflected at the output port O due to any impedance mismatch there. The feedback signal is provided at a feedback port Z of the built-in power analyzer circuit 125 and transmitted to the programmable controller 11.

The power analyzer circuit 125 may measure the normalized reflected power by either using a broadband RF V-I sensor that senses the voltage (V) and current (I) of the RF signal that exits the power analyzer circuit 125 or using a four-port directional coupler, as explained in detail in application Ser. No. 16/572,708.

The feedback signal from the feedback terminal Z is received by the programmable controller 11 and used to refine the first control signal. The refined first control signal is transmitted to the broadband tunable RF signal generator 12 and makes a correction to the RF frequency. The impedance of the output matching network circuit 115 at the corrected frequency reduces the reflected power. As explained in detail in application Ser. No. 16/572,708, this feedback loop may be designed entirely with electronic circuitry (no moving parts) for ultrafast impedance matching.

The amplified high-power RF signal output from the output matching network circuit 115 is routed to the plasma processing apparatus 17 by a route selected by a second electronic toggle switch. As shown in FIG. 1, the second electronic toggle switch connected to the output terminal O of the broadband RF power amplifier 15 may route the RF signal output from the output matching network circuit 115 either directly to the plasma processing apparatus 17 or via a bandpass filter circuit 16 using the same (second) control signal used to configure the selector 13. The direct connection is selected whenever the selector 13 is set to route the RF signal directly from the broadband tunable RF signal generator 12 to the input terminal I of the broadband RF power amplifier 15. The route via the bandpass filter circuit 16 is selected whenever the selector 13 is set to divert the continuous RF signal from the broadband tunable RF signal generator 12 to the chopper circuit 14 to provide a pulsed RF signal to the broadband RF power amplifier 15. The bandpass filter circuit 16 comprises a plurality of bandpass filters (e.g., bandpass filters 106 and 116) whose outputs are connected to appropriate electrodes of the plasma processing apparatus 17. The programmable controller 11 may also provide the control signals to the control system used to configure the electrodes of the plasma processing apparatus 17, in accordance with the process recipe 10 and the configuration of the first and second toggle switches.

FIG. 1 also illustrates additional connections that may be made between the plasma processing apparatus 17 and ground (reference potential), and DC and/or RF bias sources configured by control signals from the programmable controller 11. The presence of DC power may affect the plasma impedance and RF impedance matching may be established using the frequency sweep tuning method. In the example embodiment, illustrated in FIG. 1, these bias sources are collectively indicated by box 18. In another embodiment, some of the DC and RF bias signals may be included in the broadband plasma processing system in a manner similar to that for the RF source signal in the broadband plasma processing system 1111 depicted in FIG. 1. In such an embodiment, both the RF source and the RF bias signals may be generated by adding, for example, a second channel (or multiple channels) to the single-channel tunable signal generator 12 in FIG. 1. A multi-channel amplifier and matching circuitry combination may replace the single-channel broadband RF power amplifier 15 shown in FIG. 1. Additional chopper circuits, toggle switches, and bandpass filters may also be included. An advantage of increasing the number of channels is that it provides the capability of expanding the span of continuous and/or pulsed signal combinations of RF source, RF bias, and DC bias available for plasma processing using the multi-channel system.

Figure 2:
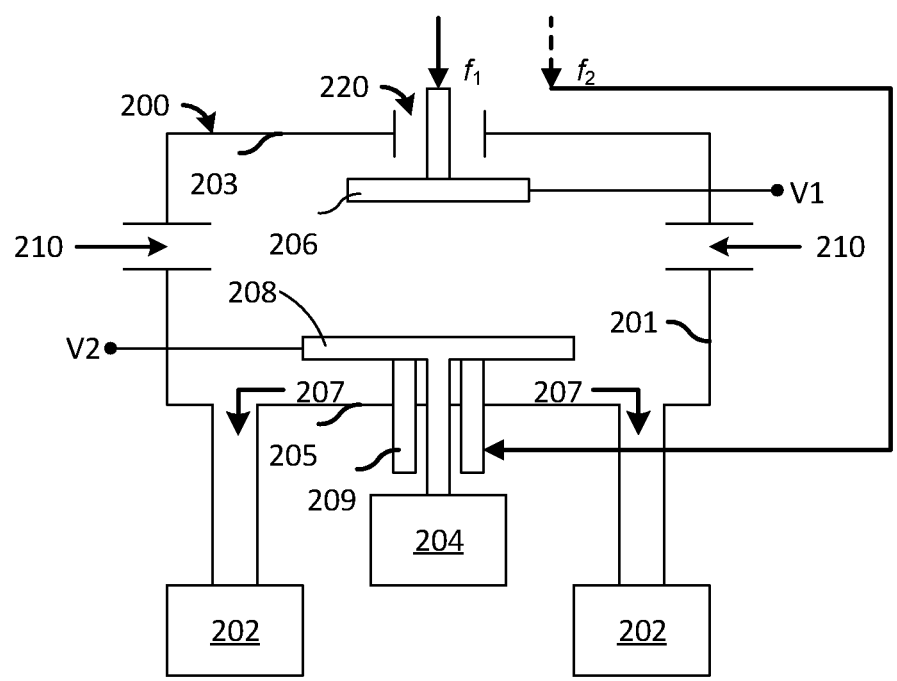
FIG. 2 is a schematic of a plasma processing apparatus comprising a plasma processing chamber illustrated in a cross-sectional view, in accordance with an embodiment of the invention.

FIG. 2 illustrates an example of a plasma processing apparatus 17 having a pair of RF electrodes inside a single plasma processing chamber 200. The first RF electrode, referred to as the top RF electrode 206, is located near the top of the plasma processing chamber 200. The second RF electrode is the substrate holder 208 fitted with RF taps 209, and is sometimes referred to as the bottom RF electrode 208. The substrate holder 208 may also have built-in heaters and coolers controlled by a feedback temperature control system 204. In the example illustrated in FIG. 2, the top and bottom RF electrodes 206 and 208 are configured to receive RF power from two output ports of the bandpass filter circuit (see box 16 in FIG. 1) corresponding to RF frequencies $f_1$ and $f_2$, and DC bias voltages V1 and V2 from DC bias sources (see box 18 in FIG. 1), respectively. The sidewall 201, base 205, and top cover 203 of the plasma processing chamber 200 may be made of a conductive material and is either grounded or floating.

As illustrated in FIG. 2, the plasma processing chamber 200 may have a gas input system comprising a showerhead 220 in the top cover 203 and inlets 210 in the sidewalls 201 and a gas exhaust system comprising outlets 207 in the base 205. Vacuum pumps 202 of a vacuum system may be used to control the pressure in the chamber and to remove exhaust gases such as product gases from the plasma processing chamber 200.

The broadband plasma processing system mi may comprise various other components (not shown), as would be known to a person skilled in the art, such as electrostatic grids, flow meters, pressure sensors, and control valves, and plasma parameter sensors such as optical emission spectroscopy (OES) sensor, a quadrupole mass spectrometer (QMS), and Langmuir probe.

The broadband plasma processing system 1111, described above with reference to FIGS. 1 and 2, is for illustrative purposes and is not limiting. For example, in some embodiments, the RF signal may be toggled between a continuous RF signal and a pulsed RF signal by toggling the duty cycle between 100% and a second value, instead of using the first toggle switch in selector 13, as illustrated in FIG. 1.

In another embodiment, the second toggle switch used to select the direct connection between the output port O and the plasma processing apparatus 17 may be eliminated. Instead, the direct connection may be incorporated along with the bandpass filters 16, and a configurable electronic switching matrix may be used to select the RF signal route between the output port O and the plasma processing apparatus 17.

In yet another embodiment, a conductive coil placed over the top cover 203 (outside the plasma processing chamber 200) may be used as the top RF electrode instead of the top RF electrode 206 placed inside the plasma processing chamber 200, as illustrated in FIG. 2.

FIGS. 3A-3E illustrate the sequential mode of operation with a first process flow and a second process flow suitable for forming topography selective films over step features in an incoming wafer. The step features depicted may comprise line and space structures. More generally, the steps may also be a part of holes (vias) or pillars. Step features, such as those illustrated in FIGS. 3A-3E, may occur in elements used in logic, interconnect or memory structures and may be fabricated all or in part by combined etch and deposition processes, including plasma processes comprising conventional non-limiting gas-phase reaction processes, as in PECVD/RIE, or self-limiting surface reaction processes, as in PEALD/PEALE. In the example process flows shown in FIGS. 3A-3E conventional non-limiting gas-phase reaction processes are illustrated, as in PECVD/RIE, in order to illustrate the sequential mode of operation. Examples of PEALD/PEALE process flows are used to illustrate the pulsed mode of operation further below.

The step features over which the topography selective films are formed (e.g., the step feature in a patterned film 310 in FIG. 3A) may have been formed earlier using suitable processing techniques, for example, by depositing a planar film and then patterning the film using photolithography and anisotropic etching techniques. In either process flow, several plasma processes are performed successively in a single plasma processing chamber (e.g., the plasma processing chamber 200 in FIG. 2) by operating the plasma processing apparatus 17 of the broadband processing system 1111 in the sequential mode. In this embodiment, the top RF electrode 206 may be configured to receive continuous RF power using the direct connection to the output port O of the broadband RF power amplifier 15. The RF frequency of the continuous RF signal powering the top RF electrode 206 may be changed between successive plasma processing steps, as described below. By applying different RF frequencies and with appropriate gas chemistry, combination of arbitrary number of conformal plasma deposition, conformal plasma etching, non-conformal plasma deposition, and non-conformal plasma etch can be chosen to achieve a desired process feature in a single process chamber. The RF frequency may be from about 400 kHz to about 300 MHz and, in some embodiments, be as high as several GHz. Generally, isotropic processes use higher RF frequency relative to anisotropic processes. Materials deposited or etched can be dielectric, semiconductor, or conductor.

Figure 3A:
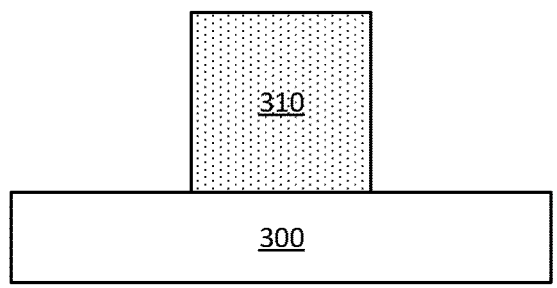
FIGS. 3A-3E illustrate two example sequences of plasma processing steps performed using a broadband plasma processing system, in accordance with an embodiment of the invention.
Figure 3B:
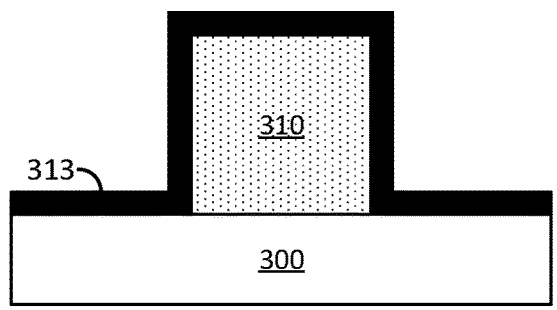

FIGS. 3A and 3B apply to both the first and second process flows. FIG. 3A illustrates a cross-sectional view of the incoming semiconductor wafer with a patterned film 310 formed on the surface over a substrate 300. Patterned film 310 may be a silicon line and the substrate 300 may be a silicon dioxide pad layer that may be a thin barrier film for a subsequent self-aligned etch step. Alternatively, 310 may be a carbon or silicon dioxide mandrel structure. The thickness of the patterned film 310 is also the step height of the vertical step feature formed by the patterning process. In FIG. 3B, a thin conformal film 313 having a thickness that is small compared to the thickness of the patterned layer 310 may be formed using a conformal PECVD process. In one embodiment, a ratio of the thickness of the patterned layer 310 (step-height) to the thickness of the thin conformal film 313 may about 2:1 to about 20:1 or any reasonable ratio. The PECVD process may be performed using a very high frequency (VHF) RF signal. The thin conformal film 313 may comprise silicon nitride and may be used as an etch barrier, or diffusion barrier, or as part of a spacer structure. The RF frequency may be from about 30 MHz to about 300 MHz, for example, 100 MHz and, in some embodiments, be as high as several GHz. Conformal depositions, such as the conformal PECVD process illustrated in FIG. 3B, are isotropic processes. Increasing a radical flux to ion flux ratio provides a more isotropic plasma process and increasing the RF frequency of RF signal helps increase the ratio.

In applications where a very thin conformal film 313 with atomic-level thickness control is desired (e.g., for ultra-thin barrier layers or for ultra-thin spacers in self-aligned multiple patterning (SAxP)), the conformal PECVD process may be replaced with a suitable PEALD process. As mentioned above, the PEALD process step may comprise a periodic sequence of discrete plasma half-reaction steps performed using a corresponding periodic sequence of pulses of RF power.

Figure 3C:
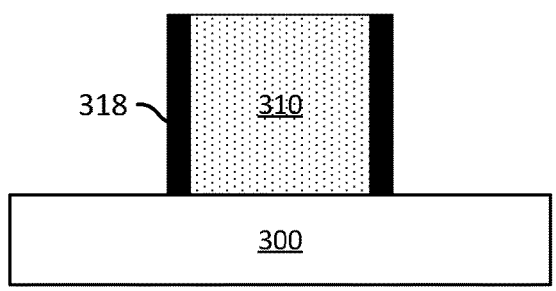
Figure 3D:
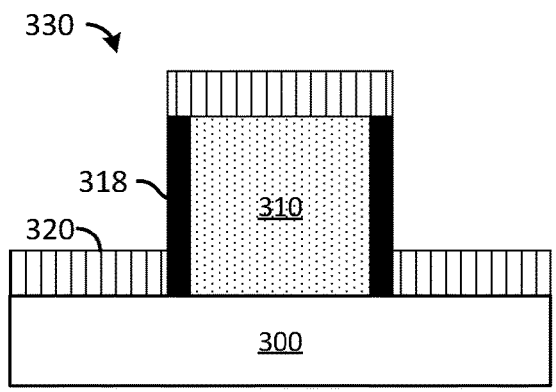

FIGS. 3C and 3D pertain to two successive plasma process steps in the first process flow that are performed subsequent to the PECVD step described above with reference to FIG. 3B. The three plasma process steps (FIGS. 3B-3D) are performed successively in the same plasma processing chamber 200 without removing the semiconductor wafer from the plasma processing chamber 200 in between the plasma processing steps.

In FIG. 3C, an anisotropic RIE process step is performed to selectively remove the thin conformal film 313 from over the planar horizontal surfaces. The thin conformal film 313 remains along the two opposing sidewalls of the vertical step feature to form thin sidewall layers 318. A thickness of the sidewall layers 318 is substantially same as the thickness of the thin conformal film 313. The etchants for the RIE process are chosen such that the chemical reaction removes the material in the thin conformal film 313 selective to the materials in the patterned film 310 and the substrate 300 that may get exposed to the etchants. The RIE process would be that typical for silicon nitride (or oxide films) and involve primarily fluorocarbon or hydrofluorocarbon gases. The RIE process is performed using a lower frequency RF signal relative to the VHF RF signal used for the PECVD process in FIG. 3B. The RF frequency may be in the high-frequency (HF) RF band from about 3 MHz to about 30 MHz, for example, 13 MHz. In order to achieve a near-vertical sidewall profile, as illustrated in FIG. 3C, the process parameters have to be adjusted to provide a plasma wherein the energy per unit area of the reactant species impinging upon horizontal surfaces is much larger than the energy per unit area of the reactant species impinging upon vertical surfaces. Generally, the energy in the vertical direction is enhanced when electrically charged ions get accelerated vertically by an electric field present in the sheath region that forms near the edges of a plasma. Accordingly, increasing the ion flux to radical flux ratio as well as increasing the vertical electric field may help skew the ion energy and ion angle distributions preferentially in the vertical direction, thereby increasing the anisotropy of a plasma process. The ion flux to radical flux ratio and the electric field in the sheath are frequency dependent, and reducing the RF frequency may enhance the anisotropy, for example, in the highly anisotropic RIE process described above.

FIG. 3D illustrates a cross-sectional view of the final structure 330 after a topography selective PECVD process is performed over the intermediate structure in FIG. 3C. As illustrated in FIG. 3D, the topography selective PECVD process selectively deposits a thin non conformal-film 320 over the exposed planar horizontal surfaces of the vertical step features of the patterned film 310 and the substrate 300. The amount of material deposited on the vertical sidewall layers 318 is negligible. The deposited thickness of the thin non conformal-film 320 is small compared to the thickness of the patterned layer 310. The anisotropic topography selective PECVD process is performed using an HF RF signal having an RF frequency from about 3 MHz to about 30 MHz, for example, 13 MHz.

Figure 3E:
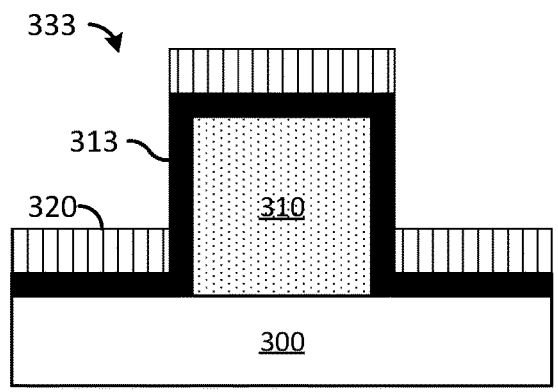

FIG. 3E illustrates the final structure 333 in the second process flow. In order to form the final structure 333, a topography selective PECVD process is performed to selectively deposit the thin non conformal-film 320 over the planar horizontal surfaces of the intermediate structure illustrated in FIG. 3B. The thin non conformal-film 320 deposited in the second process flow is substantially the same as that in the first process flow. However, the starting surfaces over which the deposition occurs in the two process flows are not the same. As seen in FIG. 3E, in the second process flow, the starting surface over which the thin non conformal-film 320 is deposited is the thin conformal film 313. In both process flows, the topography selective PECVD process is an anisotropic plasma process using an HF RF signal having an RF frequency from about 3 MHz to about 30 MHz, for example, 13 MHz to sustain the plasma.

The isotropic and anisotropic plasma process steps, described above with reference to FIGS. 3A-3E, use relatively high and low RF frequencies, respectively. The plasma process steps in the example process flows are performed sequentially using the frequency sweep tuning method for rapid impedance matching each time the plasma impedance changes due to change in RF frequency and plasma properties. Conventional CW-RF plasma deposition and etches (e.g., CW-RF PECVD/RIE) have been used to illustrate the sequential mode of operation. In contrast, the PEALD/PEALE processes use self-limiting reaction pulses for which RF pulses may be used, as discussed in further detail below. Atomic layer processing provides advantages such as, near-ideal conformality, deposition/etches with atomic-layer control, and high material selectivity in selective deposition and etching.

Figure 4:
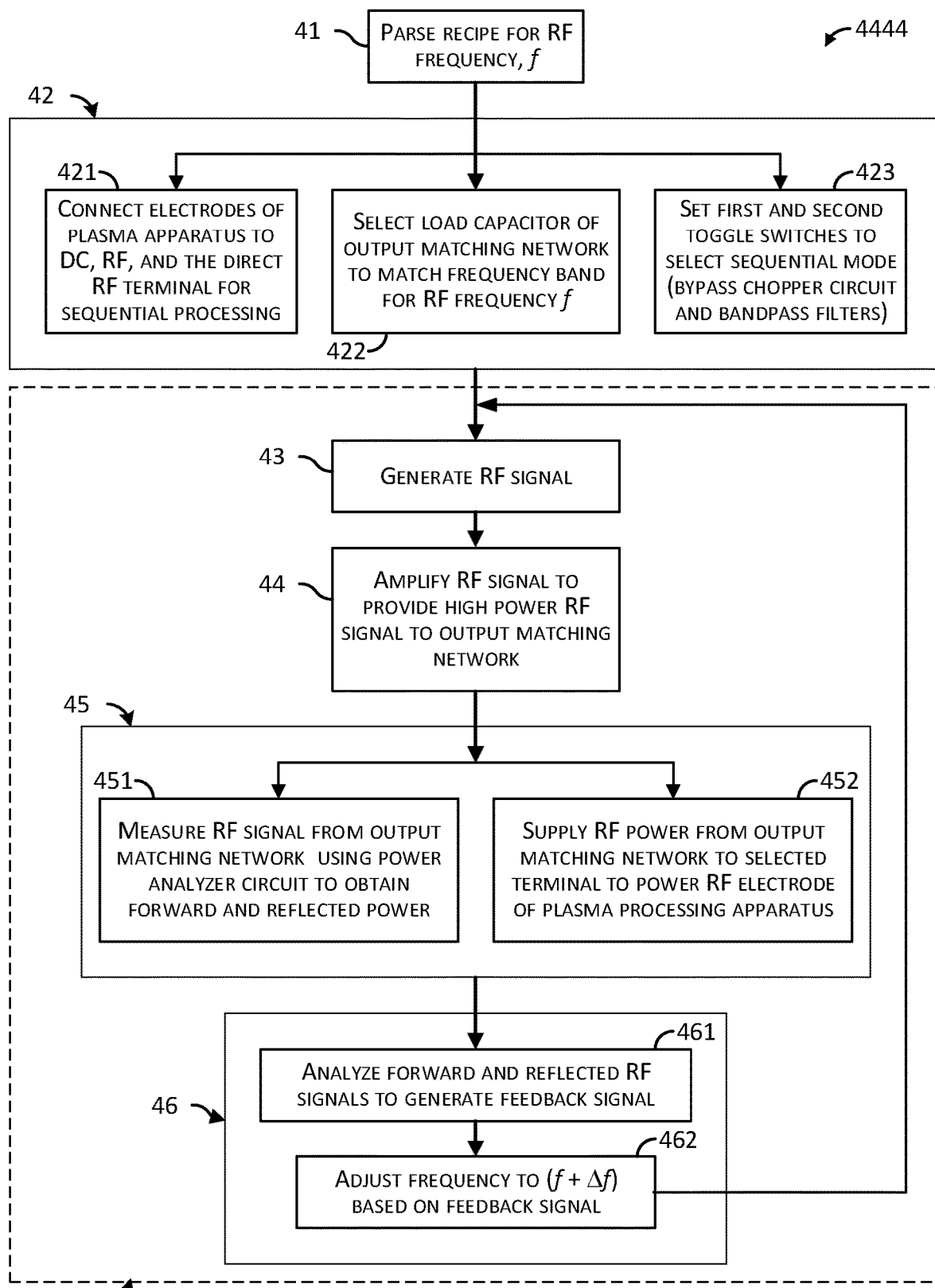
FIG. 4 illustrates a flow diagram for one plasma processing step of a sequential plasma processing flow using a broadband plasma processing system, in accordance with an embodiment of the invention.

FIG. 4 illustrates a sequential mode execution flow 4444 for executing one step of a series of plasma processing steps performed in the sequential mode, for example, the conformal PECVD process step in the first and second process flows described above with reference to FIG. 3B. The execution flow 4444 may be executed using the broadband plasma processing system 1111 (illustrated in FIG. 1). The flow diagram includes the method employed to tune the RF frequency of the RF signal used to power the plasma processing apparatus 17 in FIGS. 1 and 2. In the first two steps, 41 and 42, information from the recipe is extracted and used to configure the hardware of the broadband plasma processing system 1111. After the hardware has been configured appropriately, the frequency sweep tuning with center-frequency offset method is implemented in the subsequent steps, shown collectively in the dashed box 40, to supply RF power efficiently to the plasma processing apparatus 17 (see FIGS. 1 and 2) by tuning the impedance of the output matching network 115 in FIG. 1. The flow 4444, described with reference to FIGS. 1, 2, and 4, may be applied to execute any plasma process step performed in the plasma processing apparatus 17 operating in the sequential mode using the broadband plasma processing system 1111.

The first step 41 of the sequential mode execution flow 4444 is to parse the instructions for a programmable controller 11 entered at the process recipe 10 of the broadband plasma processing system 1111 (see FIG. 1) to identify the input process parameters such as the RF frequency (f), the configuration of the plasma processing apparatus 17 to connect its RF electrodes to appropriate ports of the bandpass filters 16, additional DC and RF bias, etc. as specified for the current plasma process step.

In the second step 42, the programmable controller 11 (see FIG. 1) generates and transmits several control signals to configure various components of the broadband plasma processing system 1111, in accordance with the input process parameters (e.g., the specified value of f).

In box 421, appropriate RF, DC, and ground terminals of the plasma processing apparatus 17 are configured to connect to respective electrodes, for example, the top RF electrode 206 and/or the bottom RF electrode 208 (see FIG. 2), in accordance with the respective control signals from the programmable controller 11.

Box 422 of the second step 42 indicates that the control signals sent to the broadband tunable RF signal generator 12 and the output matching network circuit 115 ensure that the selected tuning elements (e.g., $C_L$) of the output matching network circuit 115 corresponds to the center frequency f of the RF signal generated by the RF signal generator 12, as described above with reference to FIG. 1.

In box 423 of the second step 42, the sequential mode of operation is selected using a control signal used to synchronously set the first and second electronic toggle switches (shown in FIG. 1). The first toggle switch in selector 13 connects the RF signal directly from the RF signal generator 12 to the input I of the broadband RF power amplifier 15. The second electronic toggle switch, at terminal O of the broadband RF power amplifier 15, routes the RF signal from the output terminal O of the broadband RF power amplifier 15 directly to an RF electrode of plasma processing apparatus 17, bypassing the bandpass filters 16.

Various components of the broadband plasma processing system 1111, for example, programmable controller 11, signal generator 12, selector 13, chopper circuit 14, broadband RF power amplifier 15, and bandpass filters 16, and plasma processing apparatus 17 are as illustrated in FIGS. 1 and 2.

In the third step 43, the RF source of the broadband plasma system 1111 is activated by generating a CW-RF signal using the broadband tunable RF signal generator 12, in accordance with the control signals received during the second step 42.

In the fourth step 44, selector 13 routes the RF signal to the multi-band power amplifier and combiner 105 (see FIG. 1).

In the fifth step 45, the amplified high power RF signal from the multi-band power amplifier and combiner 105 is routed to the plasma processing apparatus 17 through the impedance of the output matching network circuit 115 (see FIG. 1) to alter the phase of the RF signal for efficient power transfer.

In box 451, the RF signal from the output matching network circuit 115 is passed through to the output port O in FIG. 1 via the power analyzer circuit 125 (see, e.g., FIG. 1) which measures the forward and reflected power at the output port O (see, e.g., FIG. 1) using a broadband RF V-I sensor or a directional coupler, as explained above and in detail in application Ser. No. 16/572,708. Reflected RF power may be detected at a port due to impedance mismatch there.

In box 452, the high power RF signal appearing at the output port O (see, e.g., FIG. 1) is routed by the second electronic toggle switch to a terminal of the plasma processing apparatus 17 connected to the RF electrode selected in step 42 (boxes 421 and 423).

The feedback loop is accomplished by the sixth step 46. In box 461, the power analyzer circuit 125 transmits a feedback signal indicative of the degree of impedance mismatch back to the programmable controller 11 of the broadband plasma processing system 1111 in FIG. 1. The feedback signal generated by the power analyzer circuit 125 may be proportional to the reflected power normalized by the forward power, as explained above.

In box 462, the feedback signal is used by the programmable controller 11 to determine a frequency adjustment $\Delta f$, and a new control signal controlling the RF frequency is transmitted to the broadband tunable RF signal generator 12 to fine tune the RF frequency. The adjusted frequency, $(f+\Delta f)$, adjusts the frequency-dependent impedance of the output matching network 115 in a direction that reduces the normalized reflected power. This feedback loop continually maintains efficient RF power transfer throughout a process step, during which the impedance of the plasma may be changing with the dynamic processing environment in the plasma processing chamber 200.

Another example of single-chamber processing of a series of plasma process steps using the sequential mode of operation is illustrated using a process flow suitable for forming a patterned hard mask used in a multiple-patterning technique, referred to as sidewall image transfer (SIT) technique.

The SIT technique, illustrated in FIGS. 5A-5D, doubles the density of features at minimum pitch by using two sidewalls formed on two opposing vertical sides of minimum-pitch lines. After forming the sidewall layer, the minimum-pitch lines, referred to as mandrels, are removed selectively without removing the sidewall layer. The sidewall layer that remains may be used as the patterned hard mask layer. For example, the sidewalls may subsequently be used as a hard mask to etch, for example, trenches in the substrate exposed between the sidewalls. The process flow is depicted in a sequence of cross-sectional views of the structure at successive stages of processing, shown in FIGS. 5A-5D.

Figure 5A:
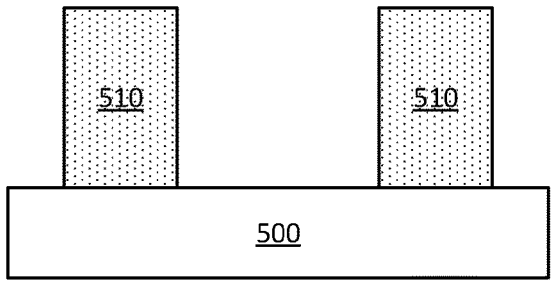
FIGS. 5A-5D illustrate an example sequence of plasma processing steps performed using a broadband plasma processing system, in accordance with an embodiment of the invention.

The incoming wafer in this example is a patterned layer of disposable mandrels 510, as illustrated in FIG. 5A. Materials used for the mandrel may comprise carbon, silicon oxide, zirconium oxide, and the like. The disposable mandrels 510 in FIG. 5A are minimum-pitch lines with near-vertical edges, and may be formed by depositing and patterning a sacrificial film over a semiconductor substrate 500 using, for example, a suitable deposition technique such as CVD, PECVD, ALD, PEALD, and the like, and patterned using any suitable method, for example, anisotropic RIE techniques with a photoresist mask. The next three steps, illustrated in FIGS. 5B-5D, may be performed in the plasma processing chamber 200 operated in a sequential mode using the broadband plasma processing system 1111.

Figure 5C:
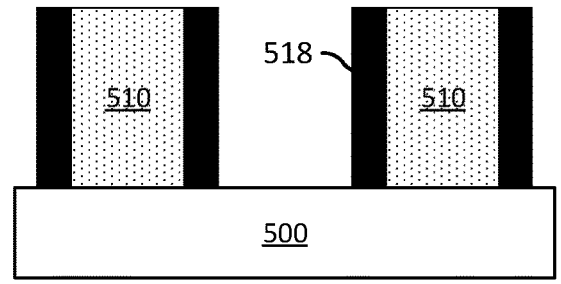
Figure 5B:
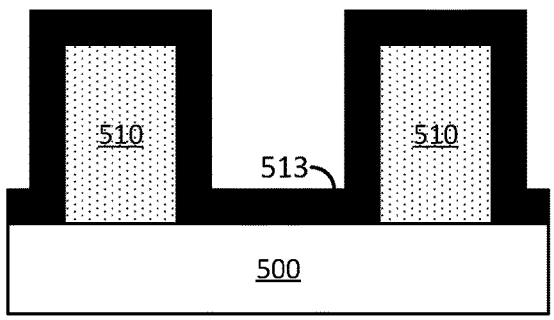

In FIG. 5B, a thin conformal film 513 of the hard mask material (e.g., silicon oxide, silicon nitride, or the like) may be formed using a conformal PECVD process, wherein the plasma is sustained by RF power supplied at a first signal frequency $(f_1)$ in the VHF RF band (30 MHz to 300 MHz), for example, at 100 MHz. As explained above for the conformal PECVD process step illustrated in FIG. 3B, here too it is advantageous to use a VHF RF signal to generate a high radical flux. The material for the conformal film 513 and the plasma parameters of the PECVD process are selected such that the nucleation rate over the substrate 500 is about the same as that over the mandrels 510 to help achieve good thickness uniformity.

Similar to the process flows illustrated in FIG. 3, here too the PECVD process may be replaced with a PEALD process performed using the broadband plasma processing system 1111 in the pulsed mode if atomic level control and conformality is desired.

In FIG. 5C, sidewalls 518 of the SIT technique have been formed on opposing sides of each disposable mandrel 510. A highly anisotropic RIE process step is performed to selectively clear the conformal film 513 from over the planar horizontal surfaces. Using silicon nitride as an example conformal layer 513, a highly anisotropic etch may be effected with a fluorocarbon based RIE process. Exposure of the silicon nitride film to hydrogen ions and subsequent exposure to higher-pressure $NF_3$ plasma may be used if high selectivity to oxide films and a high degree of anisoptropy is desired.

Again, the RIE process may be replaced with a PEALE process performed using the broadband plasma processing system 1111 in the pulsed mode if atomic level control is desired.

The hard mask material adhering to the edges of the mandrels 510 form the sidewalls 518, as illustrated in FIG. 5C. The high anisotropy of the etch process provides sidewalls 518 with near-vertical edges and a thickness that is substantially same as that of the conformal film 513. The etch chemistry for the RIE process is chosen such that there is negligible material removed from the portions of the mandrels 510 and the substrate 500 that get exposed to the etchants. A second RF frequency $(f_2)$ in the high-frequency (HF) RF band (3 MHz to 100 MHz, e.g., 13 MHz) may be used for the anisotropic RIE step used to form sidewalls 518 for the same reasons as explained for the RIE step that is used to form the sidewall layers 318 (illustrated in FIG. 3C).

Figure 5D:
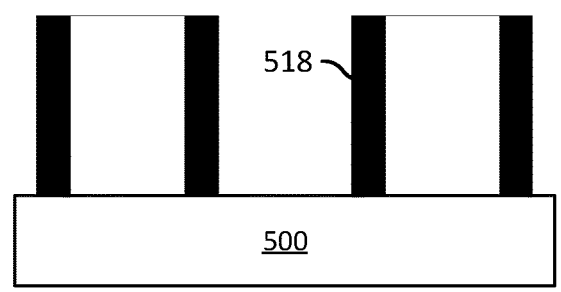

FIG. 5D illustrates the structure after the mandrels 510 in FIG. 5C have been removed selectively, leaving behind the sidewalls 518 standing over the top surface of the substrate 500. An isotropic plasma etch process may be used to remove the exposed mandrels 510, illustrated in FIG. 5C. The etchants used to remove the mandrels 510 may be selected to have a negligibly low removal rate for the materials used for the sidewalls 518 and the substrate 500 below the mandrels 510 and in between the sidewalls. A relatively high radical flux to ion flux ratio is preferred for isotropic plasma etching, similar to that for conformal PECVD since both these processes are isotropic plasma processes. It is advantageous to use a VHF RF signal in the frequency band from 30 MHz to 300 MHz for most isotropic plasma processes. In embodiments wherein the mandrel comprises silicon oxide, the mandrel may be removed using, for example, a very high selectivity chemical oxide removal (COR) plasma process, wherein an $NF_3/H_2$ plasma is used to generate radicals. The isotropic plasma etch process with which the mandrels 510 are removed may use a third frequency $(f_3)$ in the VHF RF band, for example, 60 MHz.

Although it is understood that PEALD and PEALE processes provide additional advantages, conventional CW-RF PECVD/RIE have been used in the processes illustrated in FIGS. 5A-5D as an example of the sequential mode of operation for the same reasons as mentioned above in the context of the process flows described with reference to FIGS. 3A-3E.

Figure 5E:
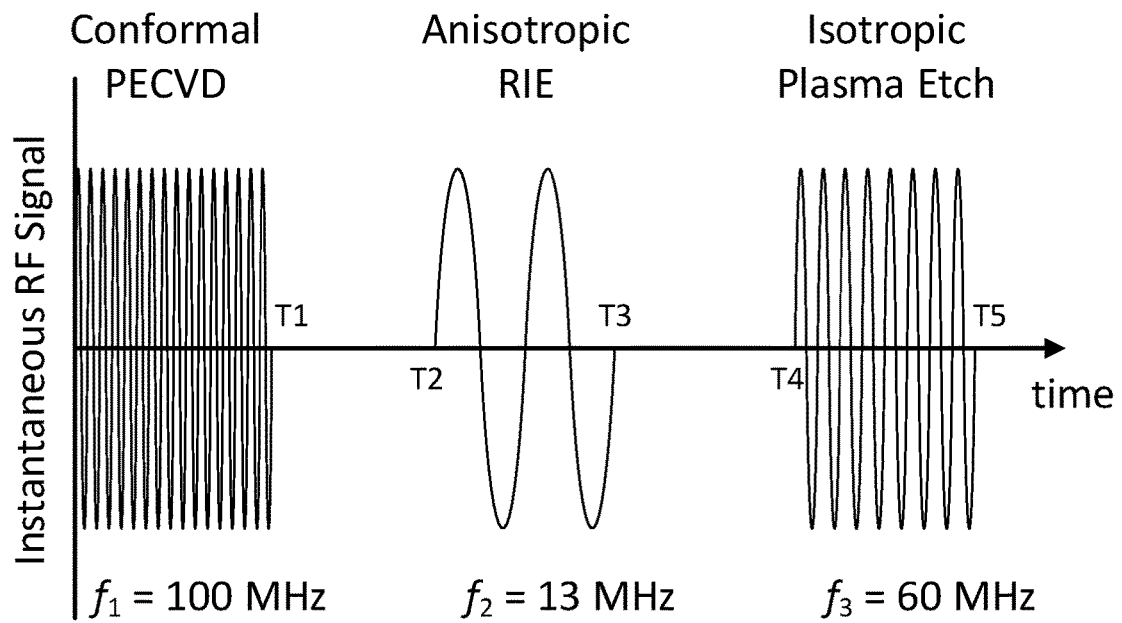
FIGS. 5E and 5F illustrate timing diagrams corresponding to the example sequence of plasma processing steps illustrated in FIGS. 5A-5D.

FIG. 5E illustrates a waveform of the RF signal during the three plasma processes performed consecutively in the plasma processing chamber 200 and illustrated in FIGS. 5B, 5C, and 5D, respectively. (In this disclosure, approximate waveforms are shown for illustrative purposes and are not drawn to scale.) The conformal PECVD process used to form the conformal film 513 is performed in time T1 in FIG. 5E using an RF signal at, e.g., $f_1$=100 MHz. Between the time T1 and T2 the broadband plasma processing system 1111 is prepared to perform the next plasma process in accordance with the respective recipe. The next step, which is the anisotropic RIE used to form the sidewalls 518, is performed from time T2 to time T3 in FIG. 5E using an RF signal at, e.g., $f_2$=13 MHz. The isotropic plasma etch used to remove the mandrels 510 is the third plasma step, is performed during the time period between T4 and T5 in FIG. 5E using an RF signal at, e.g., $f_3$=60 MHz. Preparation of the broadband plasma processing system 1111 to perform the third plasma step may be done between T3 and T4.

Figure 5F:
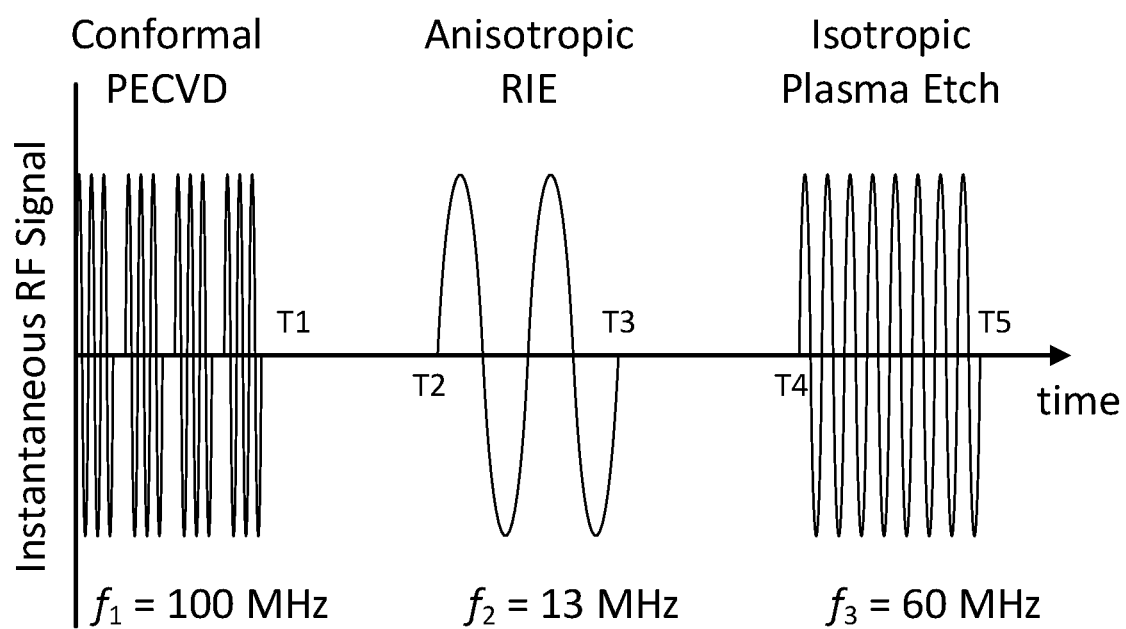

The example embodiment described with reference to FIGS. 5A-5E illustrates a process flow comprising three plasma process steps performed sequentially using CW-RF signals of three different frequencies. In another embodiment, one or more of these plasma processing steps may be performed using pulsed RF signal at the same frequency. For example, the RF signal used in the conformal PECVD step used to form the conformal film 513 in FIG. 5B may use a pulsed RF signal, as shown in the waveform illustrated in FIG. 5F. In FIG. 5F, the CW-RF signal $f_1$=100 MHz in FIG. 5E has been fragmented into four sub-pulses at the same frequency, $f_1$=100 MHz.

Yet another example of single-chamber processing of a plurality of plasma process steps using the sequential mode of operation is illustrated with reference to FIGS. 6A-6C. In this example, a precision sidewall spacer formation process is implemented in two consecutive plasma etch steps: a first etch step, which is the main etch step, followed immediately by a second etch step, which is the precise overetch step. In the instance the spacer is silicon nitride, the process gas for both etch steps may comprise $CF_4$, $CHF_3$, $C_4F_8$, and $H_2$ at moderate to low pressures ranging from about 30 mTorr to about 50 mTorr.

FIG. 6A illustrates an incoming wafer for this process flow. The incoming wafer comprises, for example, substrate 600 comprising crystalline silicon 601 with a thin silicon oxide capping layer 602, a patterned layer 610 comprising discrete steps (e.g., polysilicon lines) formed over the substrate 600, and a continuous conformal thin film 613 of the sidewall spacer material (e.g., silicon nitride) formed over the patterned layer 610 and the substrate 600. In some embodiments, the patterned layer 610 may include gate lines and may be formed using the same process, i.e., an anisotropic etch process similar to the process described in FIG. 3A.

FIG. 6B illustrates the structure of FIG. 6A after the first etch step is complete. In the first etch step an anisotropic RIE is performed that selectively removes a majority of the material of the conformal thin film 613 from its horizontal surfaces disposed over the top surfaces of the patterned layer 610 and a portion of the semiconductor substrate 600 outside the region covered by the patterned layer 610. The topography selective aspect of the anisotropic RIE process forms the non-conformal film 615, wherein the thickness of the sidewall spacer material covering the edges of the patterned layer 610 is substantially the same as the thickness of the conformal thin film 613, but the thickness of the remaining sidewall spacer material covering the horizontal surfaces (e.g., the top surfaces of the patterned layer 610 and a portion of the semiconductor substrate 600 outside the region covered by the patterned layer 610) is substantially less. Since the first etch step removes a majority of the sidewall spacer material from over the horizontal surfaces, it is referred to as the main etch. The main etch may be performed using an HF RF signal for the same reasons as explained for the anisotropic RIE steps described with reference to FIG. 3C and FIG. 5C. The RF frequency ($f_1$) may be from about 3 MHz to about 100 MHz, for example, 13 MHz.

In FIG. 6C, a second etch step is initiated and performed immediately after the main etch. The second etch step, referred to as the overetch step, is precisely controlled to clear the remaining sidewall spacer material from over the horizontal surfaces at a much slower removal rate relative to the main etch. The overetch process may be a plasma etch process providing a slow isotropic removal of the sidewall spacer material for precise timing and thickness control. As known to persons skilled in the art, it is advantageous to use a low power, VHF RF signal to perform an isotropic plasma etch with a slow removal rate, such as the overetch step. The plasma may comprise a mixture of process gases that is rich in hydrogen and lean in fluorocarbon or $NF_3$. The etch chemistry removes silicon nitride at a slow rate and is highly selective to silicon oxide. The plasma etch process parameters may also be adjusted to provide an anisotropic etch component. The RF frequency ($f_2$) may be from about 30 MHz to about 300 MHz, for example, 60 MHz. The final structure after both the main etch and overetch are complete has sidewall spacers 618 of a precise thickness formed over the edges of the steps in the patterned layer 610, as illustrated in FIG. 6C.

FIG. 6D illustrates the changes in the frequency and power of the RF signal during the main etch and overetch steps. The anisotropic RIE main etch resulting in the non-conformal film 615 is performed till time T1 in FIG. 6D, using a high power HF RF signal at, e.g., $f_1$=13 MHz. The short duration overetch is initiated at time T1 and terminated at time T2. As illustrated in FIG. 6D, the isotropic plasma etch process for the overetch uses a relatively low power VHF RF signal at, e.g., $f_2$=60 MHz.

In various embodiments, similar process flows (similar to the overetch process flow described with reference to FIG. 6) may be derived for addressing similar issues. Examples include reducing stringer defects in aspect-ratio dependent etch (ARDE) or inverse ARDE, or in-situ clean for surface conditioning, or removal of residues, for example, residual photoresist and other polymers.

Figure 7A:
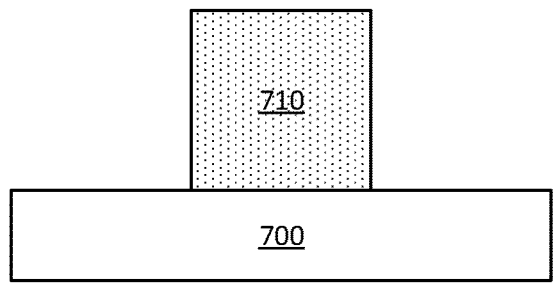
FIGS. 7A-7C illustrate an example sequence of plasma processing steps performed using a broadband plasma processing system, in accordance with an embodiment of the invention.
Figures 7B, 7C:
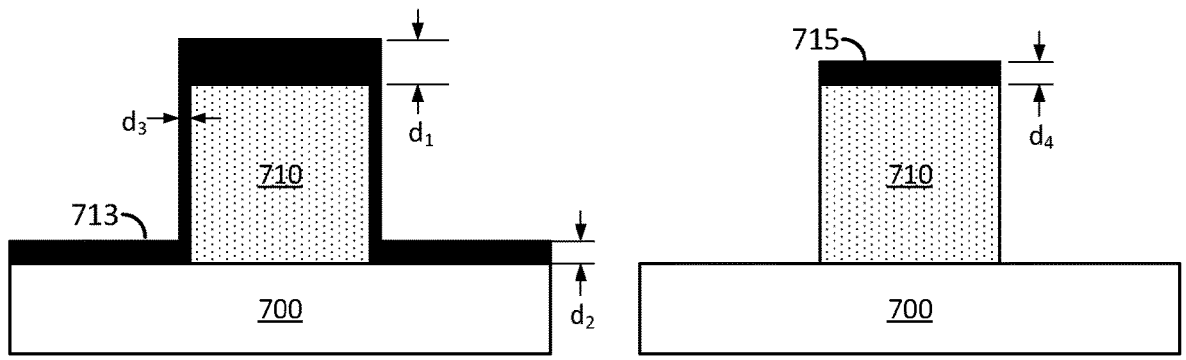

FIGS. 7A-7C illustrate one other example of plasma process steps performed successively in a single plasma processing chamber of a broadband plasma processing system (e.g., the plasma processing chamber 200 of the broadband plasma processing system 1111 in FIG. 2) using the sequential mode of operation. In this example, a non-conformal deposition and a precision isotropic etch are used to form a capping layer over a patterned layer comprising step features.

FIG. 7A illustrates an incoming wafer comprising a semiconductor substrate 700 and a patterned layer 710 formed on the semiconductor substrate 700. One step of the patterned layer 710 having substantially vertical edges is shown in FIG. 7A. The patterned layer 710 may be formed using techniques similar to the layer 310 described with reference to FIG. 3A.

In FIG. 7B, a non-conformal layer 713 has been formed using a non-conformal PECVD process. The non-conformal layer 713 may comprise, for example, silicon nitride or a carbon based material deposited using, for example, a PECVD technique, wherein a gaseous mixture of methane and hydrogen may be used to obtain desired plasma characteristics. As illustrated in FIG. 7B, the deposition process is both topography selective and area selective. Accordingly, the non-conformal layer 713 is formed with different thicknesses not only over the vertical and horizontal surfaces of the steps of the patterned layer 710 but also over the two types of horizontal surfaces: those of the patterned layer 710 and those the semiconductor substrate 700. As illustrated in FIG. 7B, the non-conformal layer 713 over the horizontal top surface of the patterned layer 710 has a first thickness, $d_1$, whereas over the horizontal top surface of the semiconductor substrate 700, the non-conformal layer 713 has a second thickness, $d_2$. A third thickness, $d_3$, of the non-conformal layer 713 of is deposited over the vertical edges of the step in the patterned layer 710. In the example embodiment, illustrated in FIGS. 7A-7C, $d_3 < d_2 < d_1$; the deposited non-conformal layer 713 is thickest over the top of the steps of the patterned layer 710 and thinnest over the vertical edges. The non-conformal PECVD process, being an anisotropic plasma process, is performed using an HF RF signal with a first RF frequency of, for example, $f_1 = 13$ MHz in the HF RF frequency band between 3 MHz to 30 MHz.

Referring now to FIG. 7C, a portion of the non-conformal layer 713 is removed using a short duration, low power isotropic plasma etch process. The plasma may be a gaseous mixture comprising, for example, $CF_4$ or ozone mixed with oxygen at a relatively high pressure (e.g., about 100 mTorr to about 200 mTorr) to avoid re-deposition. The flow rate of the gases may be adjusted to maintain a low concentration of oxygen such that the mixture may be about 5% oxidant to about 10% oxidant. In some embodiment, a very low RF bias power may also be used. The etch exposes the horizontal top surface of the semiconductor substrate 700 outside the region covered by the patterned layer 710 without exposing the horizontal top surface of the steps of the patterned layer 710 where the deposited thickness of the non-conformal layer 713 was the highest. The vertical sides of the steps in the patterned layer 710, where the non-conformal layer 713 was the thinnest, are also exposed by this etch. A low etch-rate isotropic plasma etch process may be used to perform this etch, wherein the duration of the RF signal is precisely controlled to terminate etching after sufficient material is removed to expose the horizontal top surface of the semiconductor substrate 700. The precise thickness control leaves a thin cap layer 715 having a controlled fourth thickness, $d_4$, remaining over the top horizontal surfaces of the steps of the patterned layer 710, as illustrated in FIG. 7C. The thickness, $d_4$, is substantially close to the difference between the deposited thickness, $d_1$, of the non-conformal layer 713 over the top horizontal surface of the patterned layer 710 (which is the thickest portion of the patterned layer 710) and the thickness of the thicker of the two other portions of the patterned layer 710 removed to expose the respective layer below. In this example, $d_3 < d_2$. So, the thickness of the cap layer 715 ($d_4$) is close to ($d_1 - d_2$). The low etch-rate isotropic plasma etch process is performed using a VHF RF signal with a second RF frequency of, for example, $f_2 = 100$ MHz in the VHF RF frequency band between 60 MHz to 300 MHz, similar to the overetch process described above with reference to FIGS. 6B and 6C.

Figure 7D:
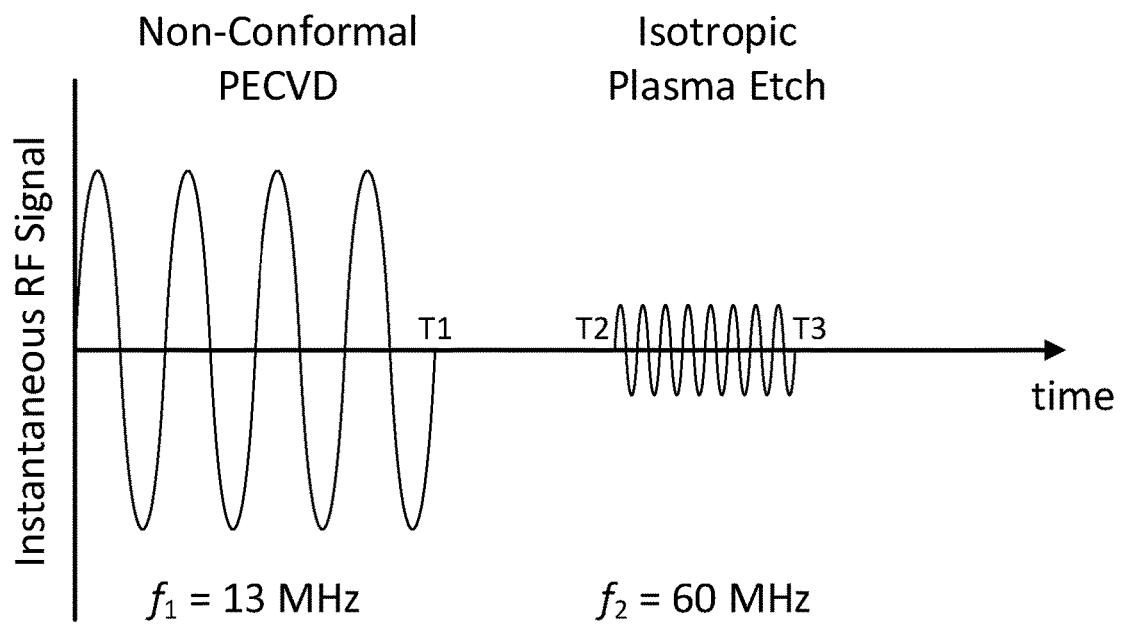
FIG. 7D illustrates a timing diagram corresponding to the example sequence of plasma processing steps illustrated in FIGS. 7A-7C.

FIG. 7D illustrates the changes in the frequency and power of the RF signal during the non-conformal PECVD and the isotropic plasma etch process steps performed successively in the plasma processing chamber 200. As indicated in the timing diagram in FIG. 7D, an HF RF signal at, e.g., $f_1 = 13$ MHz is used for a time period T1, during which the non-conformal PECVD forms the non-conformal layer 713 shown in FIG. 7B. Between the time T1 and T2, the broadband plasma processing system mi may be reconfigured in accordance with the recipe for the next plasma process. The next step is the short duration, low power isotropic plasma etch. As illustrated in FIG. 6D, the isotropic plasma etch process uses a relatively low power VHF RF signal at, e.g., $f_2 = 60$ MHz from time T2 to time T3.

Figure 8A:
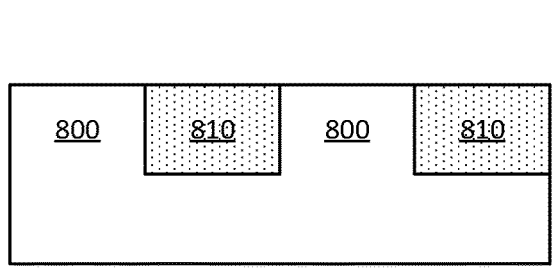
FIGS. 8A-8D illustrate one example sequence of plasma processing steps performed using a broadband plasma processing system, in accordance with an embodiment of the invention.
Figure 8B:
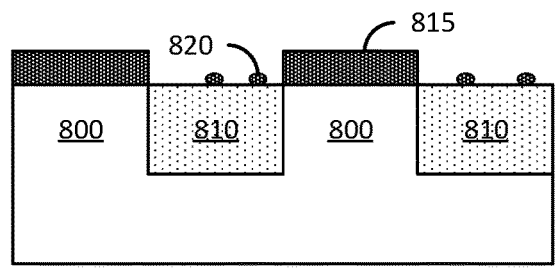
Figure 8C:
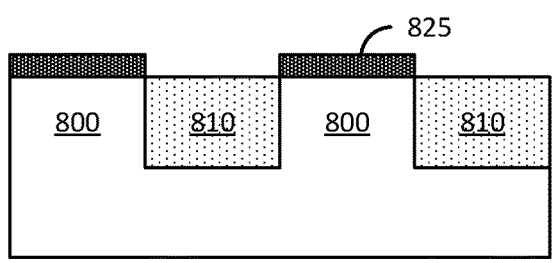

The next example of single-chamber plasma processing, illustrated in FIGS. 8A-8C, is that of a cyclic area selective deposition process performed by the broadband plasma system 1111 in the dual-frequency pulsed mode of operation. The cyclic area selective deposition in this example utilizes the cyclic deposition-and-etch technique. Area selective deposition processes, such as the cyclic area selective deposition process described herein, may be applied to achieve bottom-up patterning. It is understood that other applications of the cyclic deposition-and-etch technique, for example, the Bosch etch process often used to etch silicon to form through-silicon vias, may also benefit from process flows performed using a broadband plasma processing system, such as broadband plasma processing system 1111 illustrated in FIGS. 1 and 2.

In one embodiment, each cycle of the cyclic area selective deposition process comprises two parts. During the first part, a thin layer of material is deposited using a PEALD step using a first RF frequency $f_1$. In the second part, a portion of the deposited material is removed using a PEALE step using a second RF frequency $f_2$, as described in further detail below. Various combinations of materials may be used. For example, in one embodiment, silicon nitride may be deposited selective to metal or to oxide. In some other embodiments, silicon oxide may be deposited, selective to metal or to nitride.

FIG. 8A illustrates an incoming wafer with a top surface comprising two areas; a first area 800 of a first material, and a second area 810 of a second material. For example, the first area 800 may be the surface of a semiconductor such as bulk crystalline silicon, and the second area 810 may comprise an insulator such as silicon oxide inlaid in the silicon substrate, as illustrated in FIG. 8A.

In FIG. 8B a thin layer 815 of a material, for example, a thin layer of silicon nitride, is formed using, for example, a PEALD technique. In the example embodiment, the nucleation of the silicon nitride takes place first over the first area 800 comprising, for example, silicon, in preference over the second area 810 comprising, for example, silicon oxide. Accordingly, the thin layer 815 gets selectively deposited over the first area 800 by the PEALD process. However, delayed nucleation over the silicon oxide surface in the second area 810 may occur, resulting in island defects 820 comprising small discrete regions of silicon nitride, as illustrated in FIG. 8B. These undesirable island defects 820 degrade the selectivity of the deposition process and, if not removed, there is a possibility of even forming a continuous film of, for example, silicon nitride over the second area 810. Accordingly, in the example embodiment, the PEALD is interrupted after a pre-determined first period during which the thin layer 815 is formed, and the plasma processing apparatus 17 (see FIGS. 1 and 2) is reconfigured to perform a short isotropic plasma etch using a PEALE technique to remove any island defects 820 that may have formed over the second area 810.

In FIG. 8C, the islands 820 have been removed. In the example embodiment, the removal is achieved by performing a short isotropic PEALE step for a second period after the pre-determined first period of PEALD is completed.

After the PEALE step is complete, the plasma processing apparatus 17 may be reconfigured to resume the PEALD for another period. The pair of processing steps, one PEALD step and one PEALE step, constitute one cycle of the cyclic area selective deposition process. By periodically removing the islands 820 with the isotropic plasma etch step, the cyclic area selective deposition process maintains high area selectivity. A portion of the thin layer 815 may also be lost during the isotropic plasma etch step. The post-etch layer 825, illustrated in FIG. 8C, comprises a portion of the thin silicon nitride layer 815 remaining over the first area 800 at the end of the first cycle of the cyclic area selective deposition process.

Figure 8D:
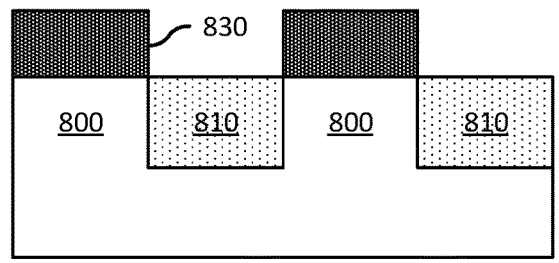

FIG. 8D illustrates the structure after multiple cycles of the cyclic area selective deposition process have been performed for the deposited layer 830 to reach a target thickness.

Figure 8E:
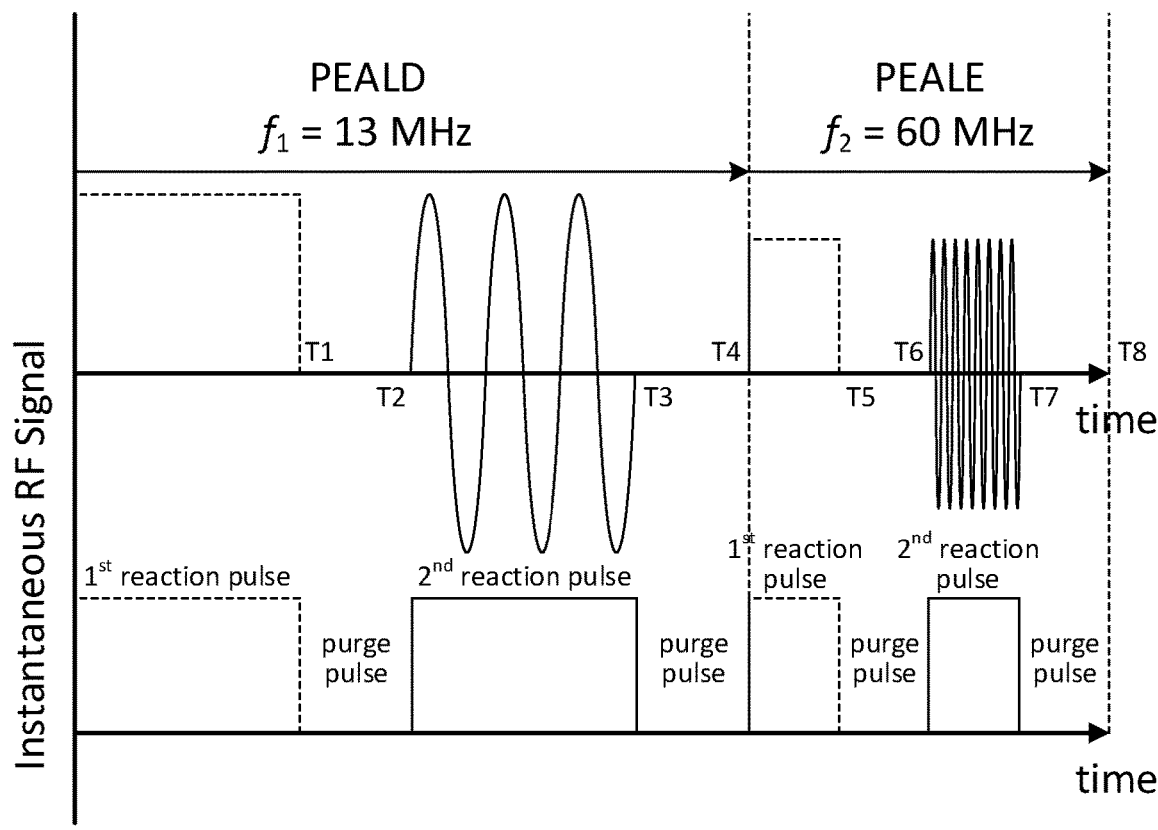
FIG. 8E illustrates a timing diagram corresponding to the example sequence of plasma processing steps illustrated in FIGS. 8A-8D.

The cyclic area selective deposition process, described with reference to FIGS. 8A-8D, is implemented with a PEALD step and a PEALE step used in each cycle in this example embodiment. The PEALD and PEALE steps may be performed by the broadband plasma processing system 1111 operating the plasma processing apparatus 17 in the pulsed mode. FIG. 8E illustrates the corresponding RF pulses for one cycle of the cyclic area selective deposition process, in accordance with one embodiment. For illustrative purposes, in FIG. 8E, the pulsed RF signal for one cycle of the cyclic area selective deposition process is represented by the RF pulses for one reaction cycle of the PEALD process and one reaction cycle of the PEALE process. It is understood that, in the process recipe, one cycle of the cyclic area selective deposition process may comprise several PEALD reaction cycles and several PEALE reaction cycles. One reaction cycle of an atomic layer process generally comprises a first reaction pulse during which a first self-limiting half-reaction is performed, and a second reaction pulse during which a second self-limiting half-reaction is performed which completes the chemical reaction to achieve the deposition (for PEALD) or removal (for PEALE) of one atomic layer. Each reaction pulse is followed by a purge pulse during which gaseous by-products and excess reactants may be removed by the vacuum pumps 202 through the outlets 207 of the plasma processing chamber 200 (see FIG. 2).

FIG. 8E illustrates both the pulsed RF signal and the control pulse train that may be used by the chopper circuit 14 (see FIG. 1) to modulate a CW-RF signal to generate the unbroken-pulse RF signal comprising unbroken RF pulses. In this example embodiment, the first RF pulse corresponds to the second reaction pulse of the PEALD reaction cycle. During the first reaction pulse (duration of T1 in FIG. 8E) a precursor adsorption may be performed in the absence of plasma. In the timing diagrams in FIG. 8E, reaction pulses in the absence of plasma are indicated by dashed rectangles. The purge pulse, immediately following the first reaction pulse, starts at T1 and terminates at T2. The RF signal is allowed to pass through the chopper circuit 14 by a low-high transition of the pulse at T2 and the plasma for the second reaction pulse of the PEALD reaction cycle is ignited. The RF frequency, $f_1$, may be about 10 MHz to about 300 MHz, for example 100 MHz. After a duration (T3–T2), the second self-limiting half-reaction of the PEALD reaction cycle completes, and a second purge pulse is initiated. At T3 in FIG. 8E, RF power is cut off by blocking the RF signal at the chopper circuit 14 using a high-low transition of the modulating pulse to extinguish the plasma discharge during the purge pulse. One PEALD reaction cycle is completed with the completion of the second purge pulse. Multiple PEALD reaction cycles (not shown) may be performed during the first part of one cycle of the cyclic area selective deposition process, in accordance with the respective process recipe 10 (see FIG. 1).

In FIG. 8E, the first part completes at a pre-determined time, T4, and the second part starts, during which the PEALE step is performed. The first PEALE reaction cycle starts at T4 with the first reaction pulse, which may comprise a surface conditioning phase. Similar to the first reaction pulse of the PEALD reaction cycle, there may not be plasma present during (T5–T4), the pulse duration of the first reaction pulse of the PEALE reaction cycle. The first purge pulse may start at T5 and be completed by T6. At T6, the second reaction pulse of the PEALE reaction cycle may be initiated. The second reaction pulse of the PEALE reaction cycle uses plasma sustained using an RF signal triggered by a low-high transition of the modulating pulse and completes at T7 with the modulating pulse extinguishing the plasma by cutting off the RF power with a high-low transition. The RF frequency, $f_2$, of the PEALE RF pulse may be about 10 MHz to about 300 MHz, for example 13 MHz. A purge pulse between T7 and T8 completes the PEALE reaction cycle. Multiple PEALE reaction cycles (not shown) may be performed to complete one cycle of the cyclic area selective deposition process, in accordance with the respective process recipe 10 (see FIG. 1).

The frequencies and amplitudes for the PEALD and PEALE RF signals (generated by the tunable RF signal generator 12 in FIG. 1), the timing for modulating pulses (generated at the chopper circuit 14 in FIG. 1, and selection of $C_L$ (in the output matching network 115 in FIG. 1) may be controlled by the programmable controller 11 of the broadband plasma processing system 1111 in FIG. 1. In this embodiment, the RF pulses of the unbroken-pulse RF signal may be of relatively long duration. In some other embodiment, the PEALD and PEALE steps may use fragmented-pulse RF signals, wherein each fragmented RF pulse is a packet comprising multiple sub-pulses of very short duration such as sub-pulse durations of about 10 microseconds to 1000 microseconds, for example, 100 microseconds.

Figure 9:
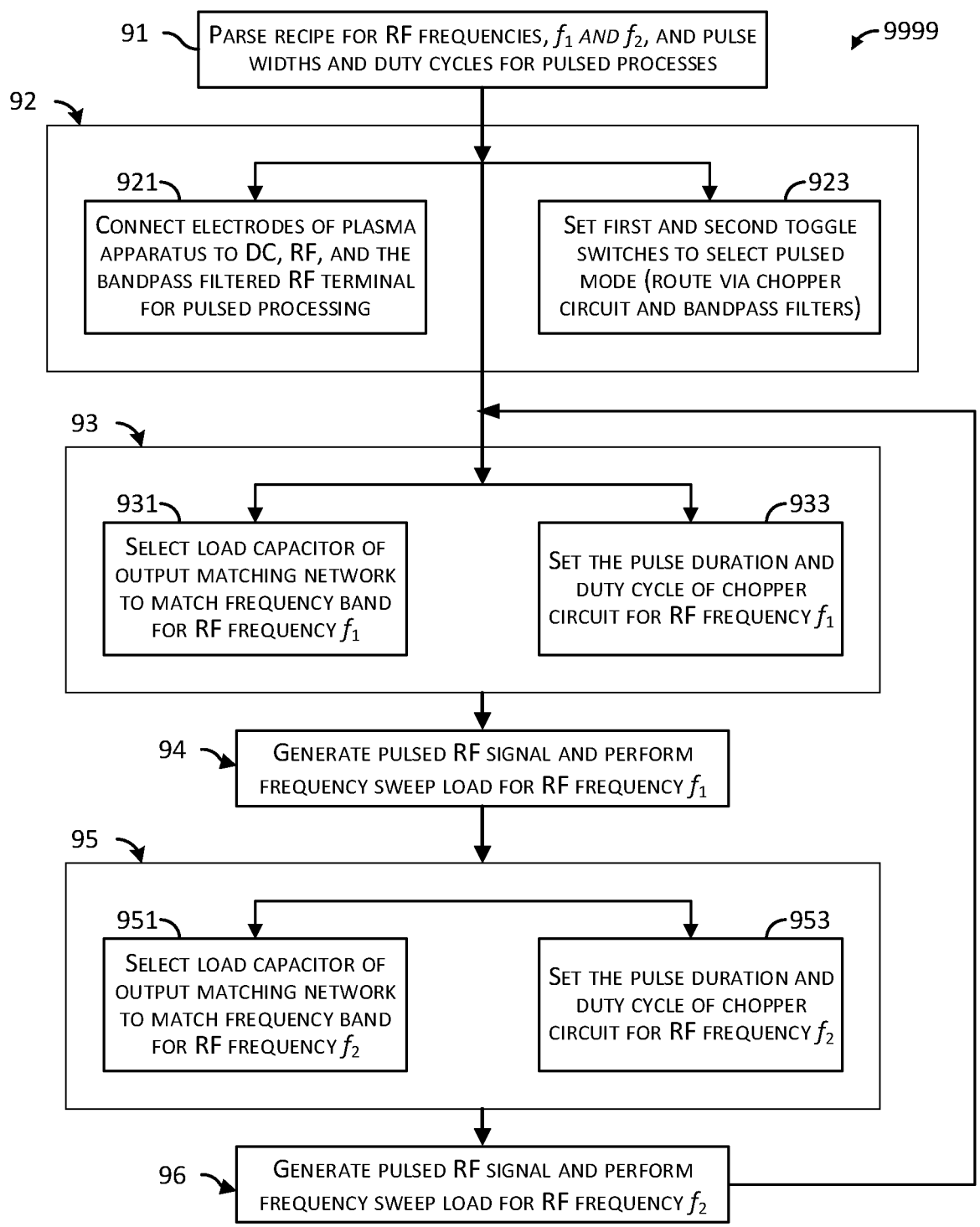
FIG. 9 illustrates a flow diagram for one cycle of a pulsed plasma processing flow using a broadband plasma processing system, in accordance with an embodiment of the invention.

FIG. 9 illustrates a flow diagram 9999 for one cycle of a cyclic two-part (e.g., a deposition part and an etch part) plasma processing flow, such as the processing flow described above with reference to FIGS. 8A-8E. In the example embodiment illustrated in FIGS. 8A-8E, the duration of the unbroken RF pulses are shown to be the same as the duration of the respective reaction pulse. As mentioned above, in another embodiment, these relatively long-duration RF pulses may be replaced with packets of several short-duration sub-pulses. Similar to the sequential mode execution flow 4444 (see FIG. 4), the first step in the pulsed mode execution flow 9999 as illustrated in box 91 is to parse the process recipe 10 (see FIG. 1) to identify the input process parameters such as the RF frequencies, $f_1$ and $f_2$, for the respective first and second part, along with the respective pulse duration and duty cycle. As in FIG. 4, next the hardware of the broadband plasma processing system 1111 is configured, as illustrated in boxes 92 and 93 in FIG. 9. Control signals from the programmable controller 11 are used to make electrical connections to the plasma processing apparatus 17, as shown in box 921 and set the two toggle switches (box 923) to route the RF signal via the chopper circuit 14 and the bandpass filters 16. For example, the output port of the bandpass filter for $f_1$ is connected to the RF electrode powered by the pulsed RF signal at frequency $f_1$. If the same RF electrode is used for the first part and the second part of one cycle then the two respective output ports of the bandpass filters 16 may be connected to one RF electrode. The RF electrode connections may be fixed for the entire duration of the cycle.

The configurations that need to be adjusted by the programmable controller 11 whenever the frequency changes from $f_1$ to $f_2$ are indicated in boxes 93 (for $f_1$) and 95 (for $f_2$). In boxes 931 and 951 the load capacitor $C_L$ of the output matching network 115 is selected, and in boxes 933 and 953 the pulse generator of the chopper circuit 14 is configured, as illustrated in FIG. 9.

After the hardware has been configured appropriately, the pulsed RF signal for the first part of the cycle is generated and the frequency sweep tuning with center-frequency offset method is employed to rapidly adjust the impedance of the output matching network 115 by adjusting the RF frequency of the pulsed RF signal within a band centered at $f_1$, as indicated in box 94. The electronic feedback control system used to achieve the least impedance mismatch is same as that described above in detail with reference to FIGS. 1, 2, and 4. When the first part using the pulsed RF signal with a center frequency $f_1$ is complete, the programmable controller 11 switches the RF center frequency to $f_2$ after re-configuring the hardware of the output matching network 115 and the chopper circuit 14 for the second part of the cycle, as indicated in boxes 95 and 96. At the end of both parts of the first cycle, the hardware setup is reset to that for frequency $f_1$ to execute the second cycle, as shown in the execution flow 9999 in FIG. 9.

Two or more RF center frequencies have been used in all the embodiments and execution flows, either sequential or pulsed mode, described above. Furthermore, all the embodiments utilize a single-channel broadband plasma processing system. Next, we disclose one example embodiment of single-frequency pulsed mode operation, and one example of dual frequency pulsed mode operation using a dual channel broadband plasma processing system (described in detail in application Ser. No. 16/572,708).

In an embodiment where the plasma processing apparatus is operated in a single-frequency pulsed mode, the RF frequency is fixed during the total processing time, but the total processing time may be partitioned into a plurality of parts, wherein during each part the number of RF pulses and/or the duty cycle may be changed in accordance with the specifications in the process recipe for the plasma process step. For example, a plasma process step such as an RIE step having a total processing time $t_0=150$ seconds may be partitioned into five parts: the main etch first part may have a processing time $t_1=100$ seconds and duty cycle $D_1=50\%$, and the subsequent four parts may have processing times $t_2$, $t_3$, $t_4$, and $t_5$ of 10 seconds each and progressively shorter duty cycles (e.g., $D_2=40\%$, $D_3=30\%$, $D_4=20\%$, and $D_5=10\%$) to progressively reduce the average RF power to the plasma. The RF signal in this example comprises five segments; each segment comprises RF pulses of progressively reducing duty cycle.

In another embodiment, a first pulsed RF signal with a center frequency $f_1$ provides an RF source power to an RF electrode of the plasma processing apparatus 17, for example, the top electrode 206 (see FIG. 2). A second pulsed RF signal with a center frequency $f_2$ provides RF bias power to the bottom electrode 208 (see FIG. 2). Pulsed plasma processes may be used in process flows for forming gate structures, spacer structures, self-aligned contact structures, and the like. The two pulsed RF signals may be provided to the plasma processing apparatus 17 using the dual channel broadband plasma processing system. As described in detail in application Ser. No. 16/572,708, the dual channel broadband plasma processing system uses a dual channel broadband tunable RF signal generator and a dual channel broadband RF power amplifier, thereby concurrently providing two high power RF signals to power RF electrodes of the same single-chamber plasma processing apparatus 17. The dual channel versions are realized by either using two single channel units in parallel or by duplicating the single channel version in one integrated unit. Rapid impedance matching is achieved in each channel by using separate electronic feedback signals providing feedback to one programmable controller controlling the hardware of the dual channel broadband plasma processing system.

Figure 10A:
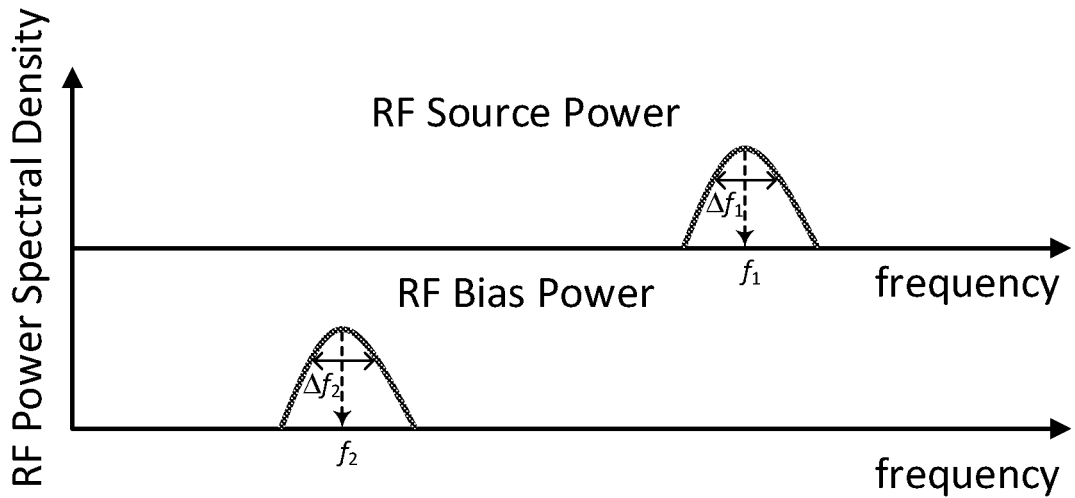
FIG. 10A illustrates power spectral densities of two RF signals for an example of dual frequency pulsed plasma processing using a dual channel broadband plasma processing system, in accordance with an embodiment of the invention.
Figure 10B:
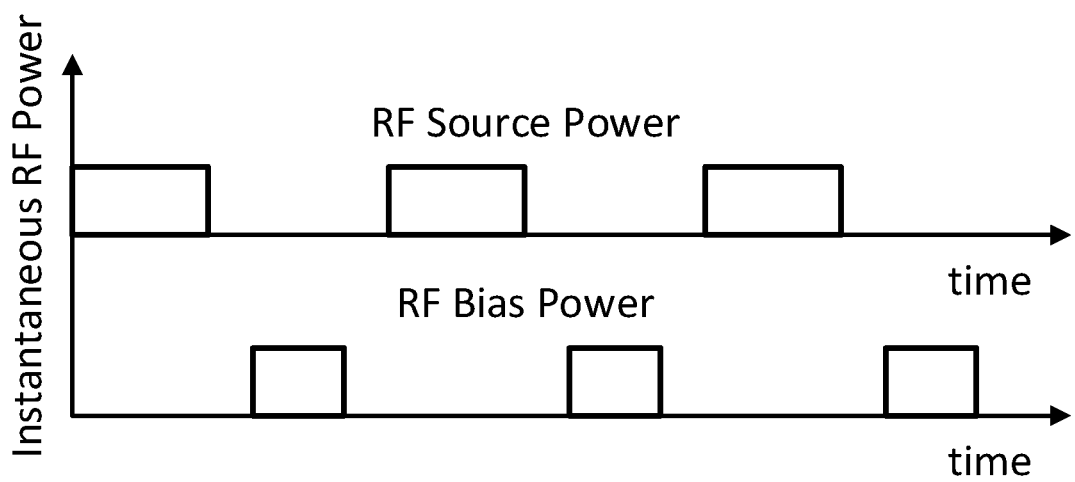
FIG. 10B illustrates timing diagrams for an example of dual frequency pulsed plasma processing using a dual channel broadband plasma processing system, in accordance with an embodiment of the invention.

FIG. 10A illustrates the power spectrum of the RF power pulses for the first (RF source) and the second (RF bias) pulsed RF signals, and FIG. 10B illustrates the RF power versus time for the two pulsed RF signals. In this embodiment, the RF source power and the RF bias power are non-overlapping in both the frequency domain and the time domain. However, it is understood that the two pulsed RF signals may overlap to some degree in some embodiments. As illustrated in the power spectrum densities in FIG. 10A, the RF bias is in a lower frequency band ($f_2 \pm \Delta f_2$) relative to the frequency band ($f_1 \pm \Delta f_1$) of the RF source. The RF power vs. time plots illustrated in FIG. 10B shows that the RF bias power is supplied in pulses in between consecutive pulses of RF source power.

Figure 10C:
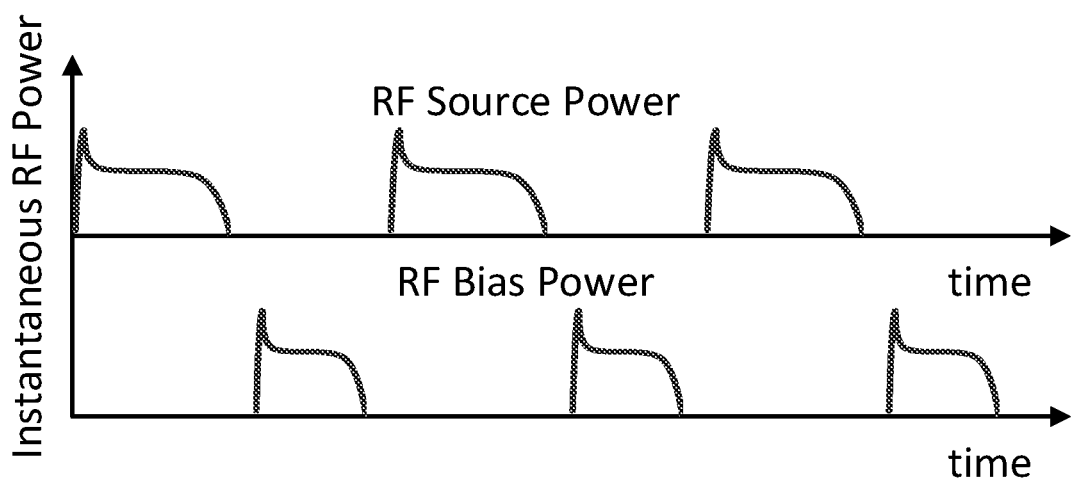
FIG. 10C illustrates corresponding timing diagrams for the example in FIG. 10B using a hypothetical broadband plasma processing system.

One benefit of rapidly establishing impedance matching using the frequency sweep tuning with center-frequency offset method is precision control of RF power. FIG. 10C illustrates the RF power versus time waveforms for a hypothetical broadband plasma processing system, wherein the impedance of the output matching network 115 is tuned using a relatively slow method (e.g., mechanically tuning the capacitance of a variable capacitor) instead of the rapid frequency sweep tuning with center-frequency offset method. As illustrated in FIG. 10C, each time the RF pulse is initiated the RF power exhibits a prominent transient behavior which eventually settles down to a steady value, as expected from an output matching network with a relatively slowly varying impedance. For example, the nominal power is not achieved until a significant time of the pulse has elapsed, for example, only after 10% to 20% of the pulse width (or alternatively sometimes never achieved) has elapsed causing uneven & unpredictable deposition/etching rates. In contrast, the corresponding waveforms in FIG. 10B show that the steady-state value is attained rapidly (e.g., in less than 1% of the pulse width), such that the transient behavior is imperceptible. In various embodiments, the steady state value may be achieved in microseconds, for example, 10 microseconds. The ability to achieve stead state rapidly also enables rapid switching or cycling between different types of plasma conditions such as etching and deposition process, which is not possible with systems exhibiting larger transients. The transient behavior seen in FIG. 10C is unpredictable and uncontrolled. Hence, the embodiments in this disclosure provide the benefit of precise RF power control, by reducing or suppressing transients in RF power with the rapid frequency sweep tuning with center-frequency offset method.

In various embodiments, process flows such as those for gate, gate spacer, self-aligned contact, bottom-up patterning, Bosch process, and the like may comprise plasma processes using pulsed-RF signals or CW-RF signals with discrete RF frequencies used concurrently, cyclically, or sequentially. These process flows may comprise plasma steps wherein conventional plasma processing (e.g., PECVD and RIE)

and/or atomic layer plasma processing (e.g., PEALD and PEALE) are used. In these applications, it may be advantageous to use embodiments of methods described in this disclosure and obtain the benefit of rapid impedance matching provided by the frequency sweep tuning method implemented in the broadband plasma processing system.

Example embodiments of the invention are summarized here. Other embodiments can also be understood from the entirety of the specification as well as the claims filed herein.

Example 1

A method of operating a plasma processing system includes determining a first frequency to power a first plasma within a plasma processing chamber. The method includes generating a first amplified RF signal having the first frequency at a broadband power amplifier. The method includes supplying the first amplified RF signal to process a substrate disposed in the plasma processing chamber using a first plasma process including the first plasma. The method includes determining a second frequency to power a second plasma within the plasma processing chamber. The method includes generating a second amplified RF signal having the second frequency at the broadband power amplifier. The method includes supplying the second amplified RF signal to process the substrate disposed in the plasma processing chamber using a second plasma process including the second plasma.

Example 2

The method of example 1, where the first amplified RF signal includes a plurality of first pulses and where the second amplified RF signal includes a plurality of second pulses.

Example 3

The method of one of examples 1 or 2, where the first amplified RF signal includes a continuous wave, and where the second amplified RF signal includes a plurality of pulses.

Example 4

The method of one of examples 1 to 3, where the first amplified RF signal includes a first continuous wave, and where the second amplified RF signal includes a second continuous wave.

Example 5

The method of one of examples 1 to 4, where the first amplified RF signal or the second amplified RF signal includes a plurality of aperiodic pulses.

Example 6

The method of one of examples 1 to 5, where determining the first frequency includes generating a first feedback signal by measuring power transferred to the first plasma, and determining the first frequency based on the first feedback signal; and where determining the second frequency includes generating a second feedback signal by measuring power transferred to the second plasma, and determining the second frequency based on the second feedback signal.

Example 7

The method of one of examples 1 to 6, further including: before determining the first frequency, selecting a load capacitor of an output matching network to a first capacitance value based on a first process recipe and powering the first plasma; and before determining the second frequency, selecting the load capacitor of the output matching network to a second capacitance value based on a second process recipe and powering the second plasma.

Example 8

The method of one of examples 1 to 7, further including: depositing a layer over the substrate using the first plasma and etching a portion of the layer using the second plasma, where the first frequency is greater than the second frequency; OR depositing a conformal layer over a feature disposed over the substrate using the first plasma, and anisotropically etching a portion of the conformal layer using the second plasma, where the first frequency is greater than the second frequency; OR using the first plasma, performing an anisotropic etching process to remove a first portion of a layer from the substrate, and using the second plasma, performing a anisotropic etching process to remove a second portion of the layer from the substrate, where the first frequency is less than the second frequency; OR depositing a non-conformal layer over a feature disposed over the substrate using the first plasma, and isotropically etching a portion of the conformal layer using the second plasma, where the first frequency is less than the second frequency.

9. The method of one of examples 1 to 7, further including: depositing a conformal layer over a feature disposed over the substrate using the first plasma; and anisotropically etching a portion of the conformal layer using the second plasma, where the first frequency is greater than the second frequency; determining a third frequency to power a third plasma within the plasma processing chamber based on measuring power transferred to the third plasma; generating a third amplified RF signal at the broadband power amplifier; supplying the third amplified RF signal to process the substrate disposed in the plasma processing chamber using a third plasma process including the third plasma; and isotropically etching the feature using the third plasma.

Example 10

A method of operating a plasma processing system includes performing a first frequency sweep tuning to generate a first radio frequency (RF) signal including a first frequency. The method includes, at a broadband power amplifier, amplifying the first RF signal to generate a first amplified RF signal. The method includes supplying the first amplified RF signal to process a substrate disposed in a plasma processing chamber, the processing of the substrate being powered by the first amplified RF signal. The method includes performing a second frequency sweep tuning to generate a second radio frequency (RF) signal including a second frequency. The method includes, at the broadband power amplifier, amplifying the second RF signal to generate a second amplified RF signal. The method includes supplying the second amplified RF signal to process the substrate disposed in the plasma processing chamber, the processing of the substrate being powered by the second amplified RF signal.

Example 11

The method of example 10, where the first radio frequency (RF) signal includes a continuous wave, where the second radio frequency (RF) signal includes a plurality of pulses, each of the plurality of pulses including a pulse duration and the second frequency. 12. The method of example 10, where the first amplified RF signal is supplied to a first electrode of the plasma processing chamber and the second amplified RF signal is supplied to a second electrode of the plasma processing chamber.

Example 12

The method of one of examples 10 or 11, where the first amplified RF signal and the second amplified RF signal together power a plasma generated within the plasma processing chamber.

Example 13

The method of one of examples 10 to 12, where supplying the first amplified RF signal includes processing the substrate using a first plasma process including a first plasma that is powered by the first amplified RF signal; and where supplying the second amplified RF signal includes processing the substrate using a second plasma process including a second plasma that is powered by the second amplified RF signal.

Example 14

The method of one of examples 10 to 13, where performing the first frequency sweep tuning includes measuring a first normalized reflected power from the plasma processing chamber, and based on measuring the first normalized reflected power, adjusting a frequency of a first preliminary RF signal being generated around a first frequency band so as to generate the first RF signal at the first frequency; and where performing the second frequency sweep tuning includes measuring a second normalized reflected power from the plasma processing chamber, and based on measuring the second normalized reflected power, adjusting a frequency of a second preliminary RF signal being generated around a second frequency band so as to generate the second RF signal at the second frequency.

Example 15

The method of one of examples 10 to 14, where the first radio frequency (RF) signal includes a plurality of first pulses, each of the plurality of first pulses including a first pulse duration and the first frequency, where the second radio frequency (RF) signal includes a plurality of second pulses, each of the plurality of second pulses including a second pulse duration and the second frequency.

Example 16

The method of one of examples 10 to 15, further including: providing a plurality of first purge pulses separating adjacent ones of the plurality of first pulses; and providing a plurality of second purge pulses separating adjacent ones of the plurality of second pulses.

Example 17

The method of one of examples 10 to 16, where the first amplified RF signal and the second amplified RF signal are coupled to a first electrode.

Example 18

A method of operating a plasma processing system includes performing a first etch/deposition process on a substrate using a first plasma in a plasma process chamber by powering the first plasma by a first amplified radio frequency signal, the first amplified radio frequency signal including a plurality of first pulses and having a first frequency and first amplitude. The method includes changing the first plasma to a second plasma. The method includes performing a second etch/deposition process on the substrate using a second plasma in the plasma process chamber by powering the second plasma by a second amplified radio frequency signal, the second amplified radio frequency signal including a plurality of second pulses and having a second frequency and second amplitude, the first frequency and the second frequency having different frequency values, where the first amplified radio frequency signal is tuned to the first frequency by a first frequency sweep tuning process and the second amplified radio frequency signal is tuned to the second frequency by a second frequency sweep tuning process.

Example 19

The method of example 18, where the first etch/deposition process includes a deposition process, and where the second etch/deposition process includes an etch process, where the second frequency is greater than the first frequency.

Example 20

The method of one of examples 18 or 19, where the first frequency sweep tuning process includes measuring a first normalized reflected power from the first plasma, and based on measuring the first normalized reflected power, adjusting a frequency of a first preliminary radio frequency signal being generated around a first frequency band so as to generate the first amplified radio frequency signal at the first frequency; and where the second frequency sweep tuning process includes measuring a second normalized reflected power from the second plasma, and based on measuring the second normalized reflected power, adjusting a frequency of a second preliminary radio frequency signal being generated around a second frequency band so as to generate the second amplified radio frequency signal at the second frequency.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method of operating a plasma processing system, the method comprising:
    determining a first frequency to power a first plasma within a plasma processing chamber;
    generating a first amplified RF signal having the first frequency at a broadband power amplifier;
    supplying the first amplified RF signal to process a substrate disposed in the plasma processing chamber using a first plasma process comprising the first plasma;
    determining a second frequency to power a second plasma within the plasma processing chamber;
    generating a second amplified RF signal having the second frequency at the broadband power amplifier; and supplying the second amplified RF signal to process the substrate disposed in the plasma processing chamber using a second plasma process comprising the second plasma.

2. The method of claim 1, wherein the first amplified RF signal comprises a plurality of first pulses and wherein the second amplified RF signal comprises a plurality of second pulses.

3. The method of claim 1, wherein the first amplified RF signal comprises a continuous wave, and wherein the second amplified RF signal comprises a plurality of pulses.

4. The method of claim 1, wherein the first amplified RF signal comprises a first continuous wave, and wherein the second amplified RF signal comprises a second continuous wave.

5. The method of claim 1, wherein the first amplified RF signal or the second amplified RF signal comprises a plurality of aperiodic pulses.

6. The method of claim 1, wherein determining the first frequency comprises generating a first feedback signal by measuring power transferred to the first plasma, and determining the first frequency based on the first feedback signal; and wherein determining the second frequency comprises generating a second feedback signal by measuring power transferred to the second plasma, and determining the second frequency based on the second feedback signal.

7. The method of claim 1, further comprising:
before determining the first frequency, selecting a load capacitor of an output matching network to a first capacitance value based on a first process recipe and powering the first plasma; and
before determining the second frequency, selecting the load capacitor of the output matching network to a second capacitance value based on a second process recipe and powering the second plasma.

8. The method of claim 1, further comprising:
depositing a layer over the substrate using the first plasma and etching a portion of the layer using the second plasma, wherein the first frequency is greater than the second frequency; OR
depositing a conformal layer over a feature disposed over the substrate using the first plasma, and anisotropically etching a portion of the conformal layer using the second plasma, wherein the first frequency is greater than the second frequency; OR
using the first plasma, performing an anisotropic etching process to remove a first portion of a layer from the substrate, and using the second plasma, performing a anisotropic etching process to remove a second portion of the layer from the substrate, wherein the first frequency is less than the second frequency; OR
depositing a non-conformal layer over a feature disposed over the substrate using the first plasma, and isotropically etching a portion of the conformal layer using the second plasma, wherein the first frequency is less than the second frequency.

9. The method of claim 1, further comprising:
depositing a conformal layer over a feature disposed over the substrate using the first plasma; and
anisotropically etching a portion of the conformal layer using the second plasma, wherein the first frequency is greater than the second frequency;
determining a third frequency to power a third plasma within the plasma processing chamber based on measuring power transferred to the third plasma;
generating a third amplified RF signal at the broadband power amplifier;

supplying the third amplified RF signal to process the substrate disposed in the plasma processing chamber using a third plasma process comprising the third plasma; and
isotropically etching the feature using the third plasma.

10. A method of operating a plasma processing system, the method comprising:
performing a first frequency sweep tuning to generate a first radio frequency (RF) signal comprising a first frequency;
at a broadband power amplifier, amplifying the first RF signal to generate a first amplified RF signal;
supplying the first amplified RF signal to process a substrate disposed in a plasma processing chamber, the processing of the substrate being powered by the first amplified RF signal;
performing a second frequency sweep tuning to generate a second radio frequency (RF) signal comprising a second frequency;
at the broadband power amplifier, amplifying the second RF signal to generate a second amplified RF signal; and
supplying the second amplified RF signal to process the substrate disposed in the plasma processing chamber, the processing of the substrate being powered by the second amplified RF signal.

11. The method of claim 10, wherein the first radio frequency (RF) signal comprises a continuous wave, wherein the second radio frequency (RF) signal comprises a plurality of pulses, each of the plurality of pulses comprising a pulse duration and the second frequency.

12. The method of claim 10, wherein the first amplified RF signal and the second amplified RF signal together power a plasma generated within the plasma processing chamber.

13. The method of claim 10,
wherein supplying the first amplified RF signal comprises processing the substrate using a first plasma process comprising a first plasma that is powered by the first amplified RF signal; and
wherein supplying the second amplified RF signal comprises processing the substrate using a second plasma process comprising a second plasma that is powered by the second amplified RF signal.

14. The method of claim 10,
wherein performing the first frequency sweep tuning comprises
measuring a first normalized reflected power from the plasma processing chamber, and
based on measuring the first normalized reflected power, adjusting a frequency of a first preliminary RF signal being generated around a first frequency band so as to generate the first RF signal at the first frequency; and
wherein performing the second frequency sweep tuning comprises
measuring a second normalized reflected power from the plasma processing chamber, and
based on measuring the second normalized reflected power, adjusting a frequency of a second preliminary RF signal being generated around a second frequency band so as to generate the second RF signal at the second frequency.

15. The method of claim 10, wherein the first radio frequency (RF) signal comprises a plurality of first pulses, each of the plurality of first pulses comprising a first pulse duration and the first frequency, wherein the second radio frequency (RF) signal comprises a plurality of second pulses, each of the plurality of second pulses comprising a second pulse duration and the second frequency.

16. The method of claim 15, further comprising:
providing a plurality of first purge pulses separating adjacent ones of the plurality of first pulses; and
providing a plurality of second purge pulses separating adjacent ones of the plurality of second pulses.

17. The method of claim 10, wherein the first amplified RF signal and the second amplified RF signal are coupled to a first electrode.

18. A method of operating a plasma processing system, the method comprising:
performing a first etch/deposition process on a substrate using a first plasma in a plasma process chamber by powering the first plasma by a first amplified radio frequency signal, the first amplified radio frequency signal comprising a plurality of first pulses and having a first frequency and first amplitude;
changing the first plasma to a second plasma; and
performing a second etch/deposition process on the substrate using the second plasma in the plasma process chamber by powering the second plasma by a second amplified radio frequency signal, the second amplified radio frequency signal comprising a plurality of second pulses and having a second frequency and second amplitude, the first frequency and the second frequency having different frequency values, wherein the first amplified radio frequency signal is tuned to the first frequency by a first frequency sweep tuning process and the second amplified radio frequency signal is tuned to the second frequency by a second frequency sweep tuning process.

19. The method of claim 18, wherein the first etch/deposition process comprises a deposition process, and wherein the second etch/deposition process comprises an etch process, wherein the second frequency is greater than the first frequency.

20. The method of claim 18,
wherein the first frequency sweep tuning process comprises
measuring a first normalized reflected power from the first plasma, and
based on measuring the first normalized reflected power, adjusting a frequency of a first preliminary radio frequency signal being generated around a first frequency band so as to generate the first amplified radio frequency signal at the first frequency; and
wherein the second frequency sweep tuning process comprises
measuring a second normalized reflected power from the second plasma, and
based on measuring the second normalized reflected power, adjusting a frequency of a second preliminary radio frequency signal being generated around a second frequency band so as to generate the second amplified radio frequency signal at the second frequency.

* * * * *